(12) United States Patent
Kim et al.

(10) Patent No.: US 12,268,064 B2
(45) Date of Patent: Apr. 1, 2025

(54) DISPLAY APPARATUS

(71) Applicant: Samsung Display Co., LTD., Yongin-si (KR)

(72) Inventors: Sunkwang Kim, Yongin-si (KR); Kinyeng Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 568 days.

(21) Appl. No.: 17/656,622

(22) Filed: Mar. 25, 2022

(65) Prior Publication Data

US 2023/0069761 A1 Mar. 2, 2023

(30) Foreign Application Priority Data

Aug. 31, 2021 (KR) .................. 10-2021-0115699

(51) Int. Cl.
*H10K 59/131* (2023.01)
*H10K 59/38* (2023.01)

(52) U.S. Cl.
CPC .......... *H10K 59/131* (2023.02); *H10K 59/38* (2023.02)

(58) Field of Classification Search
CPC .... H10K 59/131; H10K 59/38; H01L 27/124; H01L 27/1255
See application file for complete search history.

(56) References Cited

U.S. PATENT DOCUMENTS

| | | | |
|---|---|---|---|
| 11,063,107 B2 * | 7/2021 | Kim | H01L 27/124 |
| 11,201,204 B2 | 12/2021 | Jo et al. | |
| 2006/0061525 A1 * | 3/2006 | Kim | H10K 59/131 |
| | | | 345/76 |
| 2014/0239270 A1 * | 8/2014 | Ko | H10K 59/126 |
| | | | 257/40 |
| 2017/0294464 A1 * | 10/2017 | Kwon | G02F 1/13624 |
| 2017/0365217 A1 * | 12/2017 | An | G09G 3/3258 |
| 2020/0208821 A1 | 7/2020 | Moon et al. | |
| 2021/0208077 A1 | 7/2021 | Ghosh et al. | |
| 2021/0359066 A1 * | 11/2021 | An | H01L 27/124 |
| 2022/0238622 A1 * | 7/2022 | Lee | H10K 59/131 |
| 2023/0069761 A1 * | 3/2023 | Kim | H01L 27/1255 |

(Continued)

FOREIGN PATENT DOCUMENTS

| | | |
|---|---|---|
| KR | 10-0275399 B1 | 12/2000 |
| KR | 10-2017-0079978 A | 7/2017 |

(Continued)

*Primary Examiner* — Dmitriy Bolotin
(74) *Attorney, Agent, or Firm* — Womble Bond Dickinson (US) LLP

(57) ABSTRACT

A display apparatus includes: a first driving voltage line extending in a first direction on a substrate; a first common voltage line extending in the first direction on the substrate; a driving transistor connected to the first driving voltage line; a storage capacitor connected to the driving transistor; a light-emitting diode connected to the driving transistor and the storage capacitor; a second driving voltage line extending in a second direction crossing the first direction, and connected to the first driving voltage line through a contact hole; and a first intermediate layer at an intersection region between the first common voltage line and the second driving voltage line. The first intermediate layer is located between the first common voltage line and the second driving voltage line.

20 Claims, 18 Drawing Sheets

(56) References Cited

U.S. PATENT DOCUMENTS

2024/0265872 A1* 8/2024 Kim .................. H10K 59/121
2024/0324355 A1* 9/2024 Kang ............... H10K 59/80522

FOREIGN PATENT DOCUMENTS

| KR | 10-2019-0013167 A | 2/2019 |
| KR | 10-2020-0071188 A | 6/2020 |
| KR | 10-2020-0082357 A | 7/2020 |

* cited by examiner

DISPLAY APPARATUS

CROSS-REFERENCE TO RELATED APPLICATION

This application claims priority to and the benefit of Korean Patent Application No. 10-2021-0115699, filed on Aug. 31, 2021, in the Korean Intellectual Property Office, the disclosure of which is incorporated by reference herein in its entirety.

BACKGROUND

1. Field

Aspects of one or more embodiments of the present disclosure relate to a display apparatus.

2. Description of the Related Art

With the rapid development in the field of display apparatuses that visually display images according to various kinds of electric signals, various display apparatuses having excellent characteristics, such as being thin and lightweight, having low power consumption, and the like, have been introduced.

Display apparatuses may include liquid crystal display apparatuses that use light from a backlight unit without spontaneously emitting light, or light-emitting display apparatuses including display elements that may emit light. Light-emitting display apparatuses may include display elements, each including an emission layer.

SUMMARY

One or more embodiments of the present disclosure are directed to a display apparatus, and more particularly, to a structure relating to a light-emitting display apparatus.

Additional aspects and features will be set forth, in part, in the description which follows, and in part, may be apparent from the description, or may be learned by practicing one or more of the presented embodiments of the present disclosure.

According to one or more embodiments of the present disclosure, a display apparatus includes: a first driving voltage line extending in a first direction on a substrate; a first common voltage line extending in the first direction on the substrate; a driving transistor connected to the first driving voltage line; a storage capacitor connected to the driving transistor; a light-emitting diode connected to the driving transistor and the storage capacitor; a second driving voltage line extending in a second direction crossing the first direction, and connected to the first driving voltage line through a contact hole; and a first intermediate layer at an intersection region between the first common voltage line and the second driving voltage line. The first intermediate layer is located between the first common voltage line and the second driving voltage line.

In one or more embodiments, the first intermediate layer may have an isolated shape, and an area of the first intermediate layer may be greater than an area of an overlapping region at which the first common voltage line overlaps with the second driving voltage line in the intersection region.

In one or more embodiments, the display apparatus may further include: a first insulating layer between the first common voltage line and the first intermediate layer; and a second insulating layer between the first intermediate layer and the second driving voltage line.

In one or more embodiments, the display apparatus may further include: a second common voltage line extending in the second direction, and connected to the first common voltage line through a contact hole; and a second intermediate layer at an intersection region between the first driving voltage line and the second common voltage line. The second intermediate layer may be located between the first driving voltage line and the second common voltage line.

In one or more embodiments, the first common voltage line may be located between the substrate and a semiconductor layer of the driving transistor, the first intermediate layer may be located at a same layer as that of a gate electrode of the driving transistor, and the second driving voltage line may be located at a same layer as that of one electrode of the storage capacitor.

In one or more embodiments, the first common voltage line may be located between the substrate and a semiconductor layer of the driving transistor, the first intermediate layer may be located at a same layer as that of the semiconductor layer of the driving transistor, and the second driving voltage line may be located at a same layer as that of one electrode of the storage capacitor.

In one or more embodiments, the first common voltage line may be located between the substrate and a semiconductor layer of the driving transistor, the first intermediate layer may be located at a same layer as that of one electrode of the storage capacitor, and the second driving voltage line may be located at a same layer as that of one electrode of the light-emitting diode.

In one or more embodiments, the first common voltage line may be located at a same layer as that of a gate electrode of the driving transistor, the first intermediate layer may be located at a same layer as that of one electrode of the storage capacitor, and the second driving voltage line may be located at a same layer as that of one electrode of the light-emitting diode.

In one or more embodiments, the first common voltage line may be located between the substrate and a semiconductor layer of the driving transistor, the first intermediate layer may be located at a same layer as that of the semiconductor layer of the driving transistor, and the second driving voltage line may be located at a same layer as that of one electrode of the light-emitting diode.

In one or more embodiments, the first common voltage line may be located between the substrate and a semiconductor layer of the driving transistor, the first intermediate layer may be located at a same layer as that of a gate electrode of the driving transistor, and the second driving voltage line may be located at a same layer as that of one electrode of the light-emitting diode.

In one or more embodiments, the display apparatus may further include: a sensing line extending in the first direction on one side of the first common voltage line; and a third intermediate layer located at an intersection region between the sensing line and the second driving voltage line. The third intermediate layer may be located between the sensing line and the second driving voltage line.

In one or more embodiments, the first intermediate layer may be spaced apart from the third intermediate layer.

According to one or more embodiments of the present disclosure, a display apparatus includes: a first driving voltage line extending in a first direction on a substrate; a first common voltage line extending in the first direction on the substrate; a buffer layer on the first driving voltage line and the first common voltage line; a transistor on the buffer layer; a storage capacitor connected to the transistor; a light-emitting diode on the storage capacitor; a second driving voltage line extending in a second direction crossing the first direction, and connected to the first driving voltage line through a contact hole; a second common voltage line extending in the second direction, and connected to the first common voltage line through a contact hole; a first intermediate layer located at an intersection region between the first common voltage line and the second driving voltage line; and a second intermediate layer located at an intersection region between the first driving voltage line and the second common voltage line.

In one or more embodiments, the first intermediate layer may be located at a same layer as that of a gate electrode of the transistor.

In one or more embodiments, the first intermediate layer may be located at a same layer as that of a semiconductor layer of the transistor.

In one or more embodiments, the storage capacitor may include a second sub-electrode located at a layer different from that of a gate electrode of the transistor, and the first intermediate layer may be located at a same layer as that of the second sub-electrode.

In one or more embodiments, the light-emitting diode may include a first electrode, an emission layer, and a second electrode, and the second common voltage line may be located at a same layer as that of the first electrode.

In one or more embodiments, the second driving voltage line may be located at a same layer as that of the first electrode.

In one or more embodiments, the storage capacitor may include a second sub-electrode located at a layer different from that of a gate electrode of the transistor, and the second common voltage line and the second driving voltage line may be located at a same layer as that of the second sub-electrode.

In one or more embodiments, the first intermediate layer and the second intermediate layer may each have an isolated shape.

The above and/or other aspects and features will become more apparent and readily appreciated from the following description of the embodiments of the present disclosure, the accompanying drawings, and the claims and their equivalents.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1A:
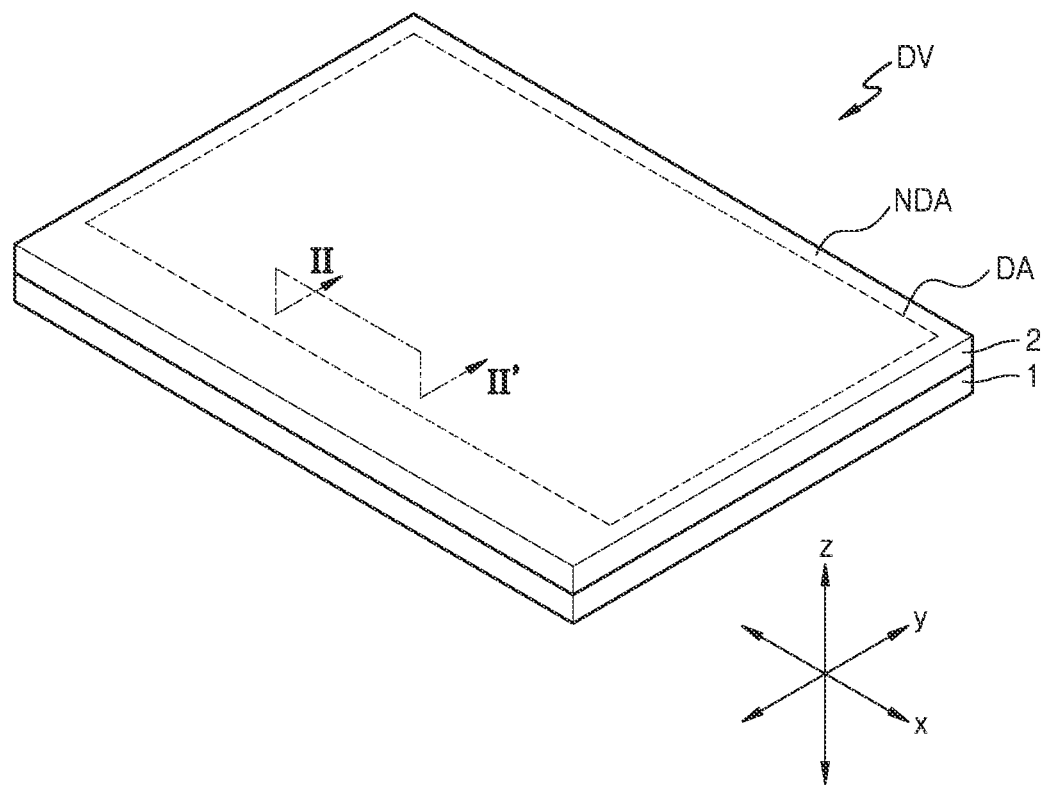
FIG. 1A is a perspective view of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected to the other layer, area, or element with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
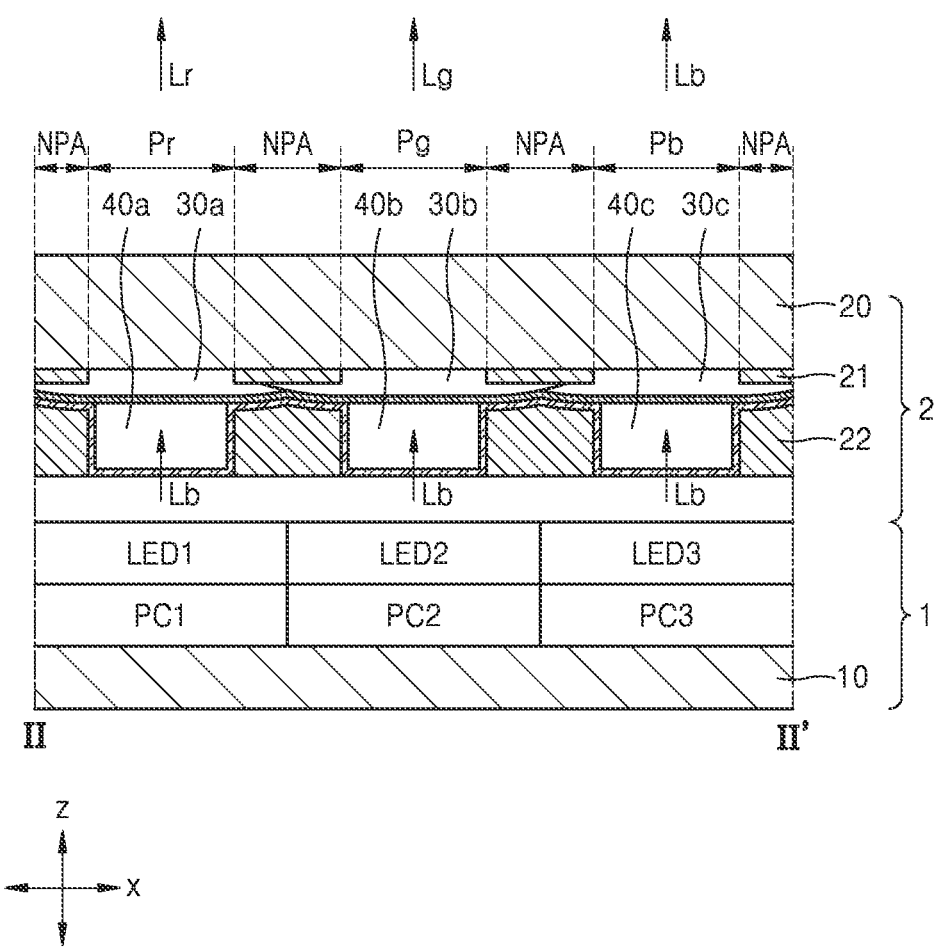
FIG. 1B is a cross-sectional view of the display apparatus taken along the line II-II' in FIG. 1A according to an embodiment.
Figure 1C:
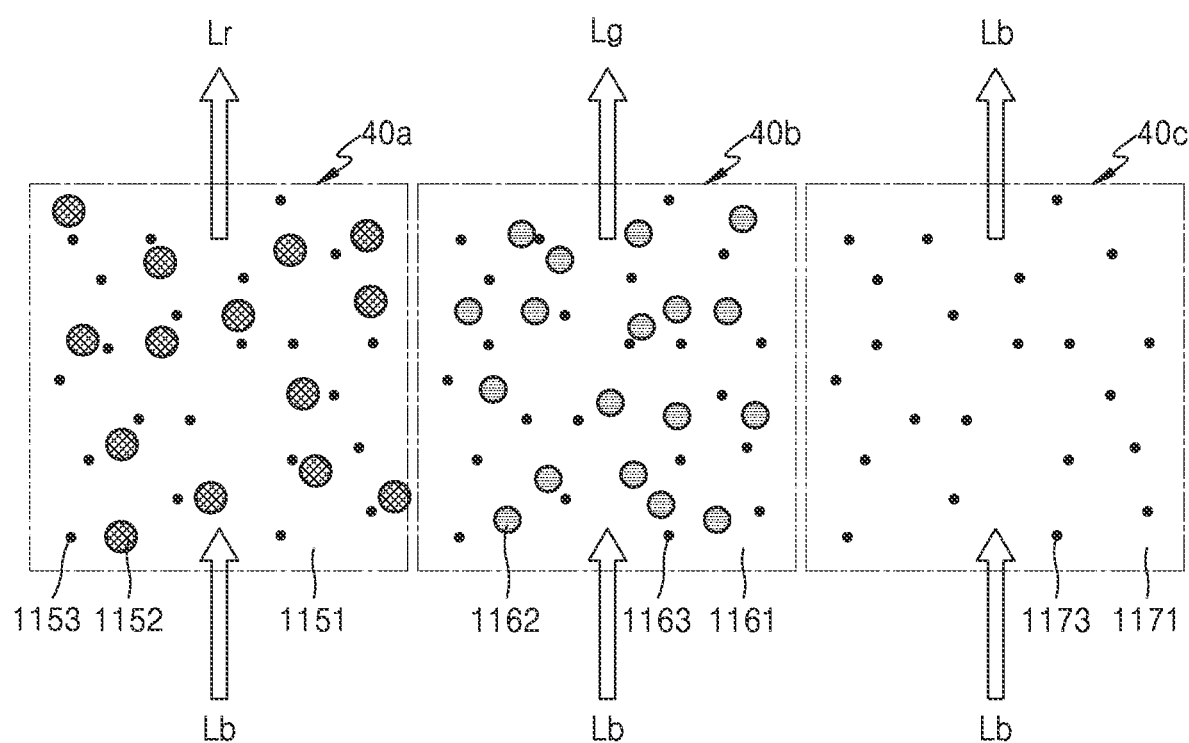
FIG. 1C is a view of various parts of a color conversion-transmission layer of FIG. 1B.

FIG. 1A is a perspective view of a display apparatus according to an embodiment, FIG. 1B is a cross-sectional view of the display apparatus taken along the line II-II' in FIG. 1A according to an embodiment, and FIG. 1C is a view of various parts of a color conversion-transmission layer of FIG. 1B.

Referring to FIG. 1A, the display apparatus DV may include a display area DA, and a non-display area NDA outside the display area DA. The display apparatus DV may display images by using an array of a plurality of pixels that may be two-dimensionally arranged at (e.g., in or on) the display area DA.

Each pixel of the display apparatus DV may be a region configured to emit light of a suitable color (e.g., a preset or predetermined color). The display apparatus DV may display images by using light emitted from the pixels. As an example, each pixel may emit red, green, or blue light.

The non-display area NDA may be a region that does not display images, and may surround (e.g., around a periphery of) the display area DA. For example, the non-display area NDA may entirely surround (e.g., around a periphery of) the display area DA. A driver or a main power line configured to provide electric signals or power to the pixels may be arranged at (e.g., in or on) the non-display area NDA. A pad may be included at (e.g., in or on) the non-display area NDA, and the pad may be a region to which electronic elements and/or a printed circuit board may be electrically connected.

The display area DA may have a polygonal shape (e.g., in a plan view), such as a quadrangle shape as shown in FIG. 1A. As an example, the display area DA may have a rectangular shape having a greater horizontal length than a vertical length, a rectangular shape having a greater vertical length than a horizontal length, or a square shape. However, the present disclosure is not limited thereto, and the display area DA may have various suitable shapes, for example, such as an elliptical shape or a circular shape.

In an embodiment, the display apparatus DV may include a light-emitting panel 1, and a color panel 2 stacked on the light-emitting panel 1 in a thickness direction (e.g., a z-direction). Referring to FIG. 1B, the light-emitting panel 1 may include a first substrate 10, first to third pixel circuits PC1, PC2, and PC3 on the first substrate 10, and first to third light-emitting diodes LED1, LED2, and LED3 connected to the first to third pixel circuits PC1, PC2, and PC3, respectively.

Light (e.g., blue light Lb) emitted from the first to third light-emitting diodes LED1, LED2, and LED3 may be converted into red light Lr, green light Lg, and blue light Lb while passing through the color panel 2, or may pass through the color panel 2 without color conversion. A region from which the red light Lr is emitted may correspond to a red pixel Pr, a region from which the green light Lg is emitted may correspond to a green pixel Pg, and a region from which the blue light Lb is emitted may correspond to a blue pixel Pb.

The color panel 2 may include a color conversion-transmission layer and a color layer. The color conversion-transmission layer may include a first color-converting part 40*a*, a second color-converting part 40*b*, and a transmission part 40*c*. The color layer may include a first color filter 30*a*, a second color filter 30*b*, and a third color filter 30*c*.

A first color region of the color panel 2 may include the first color-converting part 40a and the first color filter 30a overlapping with each other. A second color region of the color panel 2 may include the second color-converting part 40b and the second color filter 30b overlapping with each other. A third color region of the color panel 2 may include the transmission part 40c and the third color filter 30c overlapping with each other.

The color panel 2 may include a light-blocking region surrounding (e.g., around a periphery of) each of the first to third color regions. The light-blocking region may include a first light-blocking layer 21 on a second substrate 20. The first light-blocking layer 21 may include a plurality of holes formed while portions corresponding to the red pixel Pr, the green pixel Pg, and the blue pixel Pb are removed. The first light-blocking layer 21 may include a material portion arranged at (e.g., in or on) a non-pixel area NPA. The material portion may include various suitable materials that may absorb light.

The light-blocking region may include a second light-blocking layer 22 overlapping with the first light-blocking layer 21. The second light-blocking layer 22 may include a material portion arranged at (e.g., in or on) the non-pixel area NPA. The second light-blocking layer 22 may include various suitable materials that may absorb light. The second light-blocking layer 22 may include the same material as that of the first light-blocking layer 21, or include a material different from that of the first light-blocking layer 21. The first light-blocking layer 21 and/or the second light-blocking layer 22 may include an opaque inorganic insulating material, for example, such as chrome oxide or molybdenum oxide, or an opaque organic insulating material, for example, such as a black resin and/or the like.

Blue light Lb emitted from the first light-emitting diode LED1 of the light-emitting panel 1 may pass through the first color region of the color panel 2. The blue light Lb may be converted and filtered to red light Lr while passing through the color panel 2. The first color-converting part 40a and the first color filter 30a of the first color region may overlap with the first light-emitting diode LED1. The blue light Lb emitted from the first light-emitting diode LED1 may be converted by the first color-converting part 40a, and then may pass through the first color filter 30a.

The first color-converting part 40a may convert blue light Lb incident thereto into red light Lr. As shown in FIG. 1C, the first color-converting part 40a may include a first photosensitive polymer 1151, first quantum dots 1152, and first scattering particles 1153. The first quantum dots 1152 and the first scattering particles 1153 may be dispersed in the first photosensitive polymer 1151.

The first quantum dots 1152 may be excited by the blue light Lb to emit the red light Lr isotropically, the red light Lr having a greater wavelength than the wavelength of the blue light Lb. The first photosensitive polymer 1151 may include an organic material having a suitable light transmittance. The first scattering particles 1153 may allow more of the first quantum dots 1152 to be excited by scattering the blue light Lb that is not absorbed in the first quantum dots 1152, and thus, a color-converting efficiency may be improved. The first scattering particles 1153 may include, for example, titanium oxide ($TiO_2$), or metal particles. The first quantum dots 1152 may include one of a Group II-Group VI compound, a Group III-Group V compound, a Group IV-Group VI compound, a Group IV element, a Group IV compound, and a suitable combination thereof.

The red light Lr converted by the first color-converting part 40a may have improved color purity while passing through the first color filter 30a. The first color filter 30a may include a pigment or a dye of a first color (e.g., red).

Blue light Lb emitted from the second light-emitting diode LED2 of the light-emitting panel 1 may pass through the second color region of the color panel 2. The blue light Lb may be converted and filtered to green light Lg while passing through the color panel 2. The second color-converting part 40b and the second color filter 30b of the second color region may overlap with the second light-emitting diode LED2. The blue light Lb emitted from the second light-emitting diode LED2 may be converted by the second color-converting part 40b, and then may pass through the second color filter 30b.

The second color-converting part 40b may convert blue light Lb incident thereto into green light Lg. The second color-converting part 40b may overlap with the second color filter 30b. As shown in FIG. 1C, the second color-converting part 40b may include a second photosensitive polymer 1161, second quantum dots 1162, and second scattering particles 1163. The second quantum dots 1162 and the second scattering particles 1163 may be dispersed in the second photosensitive polymer 1161.

The second quantum dots 1162 may be excited by the blue light Lb to emit the green light Lg isotropically, the green light Lg having a greater wavelength than the wavelength of the blue light Lb. The second photosensitive polymer 1161 may include an organic material having a suitable light transmittance.

The second scattering particles 1163 may allow more of the second quantum dots 1162 to be excited by scattering the blue light Lb that is not absorbed in the second quantum dots 1162, and thus, a color-converting efficiency may be improved. The second scattering particles 1163 may include, for example, titanium oxide ($TiO_2$), or metal particles. The second quantum dots 1162 may include one of a Group II-Group VI compound, a Group III-Group V compound, a Group IV-Group VI compound, a Group IV element, a Group IV compound, and a combination thereof.

In an embodiment, the first quantum dots 1152 may include the same or substantially the same material as that of the second quantum dots 1162. In this case, the size of the first quantum dots 1152 may be greater than the size of the second quantum dots 1162.

The green light Lg converted by the second color-converting part 40b may have improved color purity while passing through the second color filter 30b. The second color filter 30b may include a pigment or a dye of a second color (e.g., green).

Blue light Lb emitted from the third light-emitting diode LED3 of the light-emitting panel 1 may pass through the third color region of the color panel 2. The transmission part 40c and the third color filter 30c of the third color region may overlap with the third light-emitting diode LED3. Blue light Lb emitted from the third light-emitting diode LED3 may pass through the transmission part 40c without color conversion (e.g., without being color converted), and then may be emitted to the outside through the third color filter 30c.

The transmission part 40c may transmit blue light Lb incident into the transmission part 40c without color conversion. As shown in FIG. 1C, the transmission part 40c may include a third photosensitive polymer 1171 in which third scattering particles 1173 are dispersed. The third photosensitive polymer 1171 may include an organic material having a suitable light transmittance, for example, such as a silicon resin, an epoxy resin, and/or the like, and may include the same or substantially the same material as those of the first and second photosensitive polymers 1151 and 1161. The third scattering particles 1173 may scatter the blue light Lb, and emit the blue light Lb. The third scattering particles 1173 may include the same or substantially the same material as those of the first and second scattering particles 1153 and 1163.

The blue light Lb passing through the transmission part 40*c* may have improved color purity while passing through the third color filter 30*c*.

The first to third light-emitting diodes LED1, LED2, and LED3 may each include an organic light-emitting diode including an organic material. In another embodiment, the first to third light-emitting diodes LED1, LED2, and LED3 may each include an inorganic light-emitting diode including an inorganic material. The inorganic light-emitting diode may include a PN-junction diode including inorganic semiconductor-based materials. When a forward voltage is applied to a PN-junction diode, holes and electrons are injected, and energy created by recombination of the holes and the electrons is converted to light energy, and thus, light of a suitable color (e.g., a preset or predetermined color) may be emitted. The inorganic light-emitting diode may have a width in the range of several micrometers to hundreds of micrometers, or several nanometers to hundreds of nanometers. In an embodiment, the first to third light-emitting diode LED1, LED2, and LED3 may include quantum dots. As described above, an emission layer of the first to third light-emitting diodes LED1, LED2, and LED3 may include an organic material, an inorganic material, quantum dots, an organic material and quantum dots, or an inorganic material and quantum dots.

The display apparatus DV having the above-described structure may be used for (e.g., may be implemented as) mobile phones, televisions, advertisement boards, monitors, tablet personal computers, notebook computers, and/or the like, but the present disclosure is not limited thereto.

Figure 2:
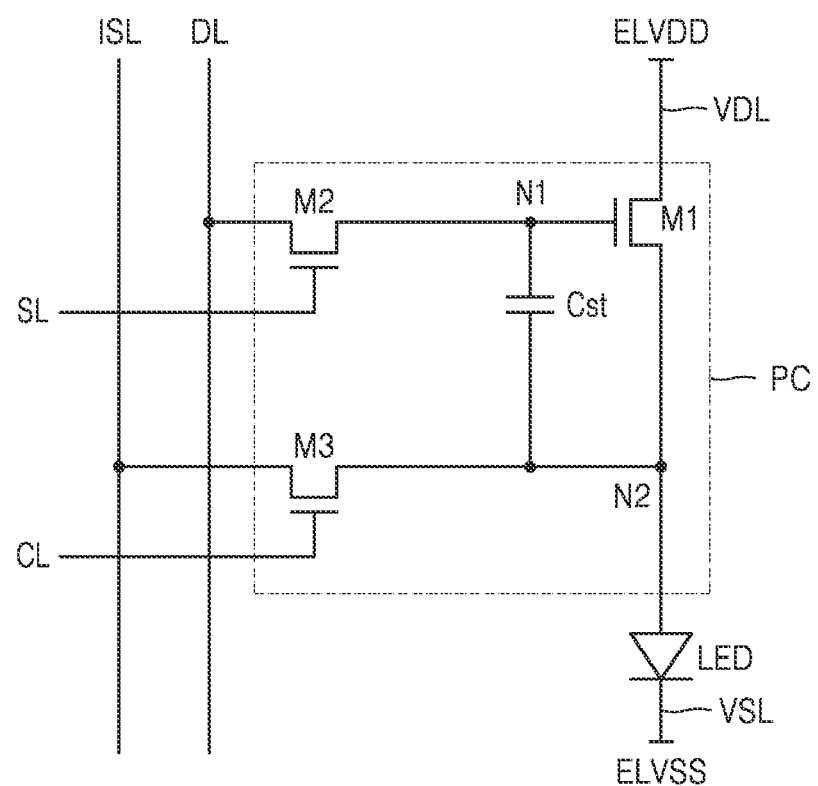
FIG. 2 is an equivalent circuit diagram of a pixel circuit electrically connected to a light-emitting diode included in a light-emitting panel of a display apparatus according to an embodiment.

FIG. 2 is an equivalent circuit diagram of a pixel circuit electrically connected to a light-emitting diode included in a light-emitting panel of a display apparatus according to an embodiment.

Referring to FIG. 2, a light-emitting diode LED may be connected to a pixel circuit PC. For example, a first electrode (e.g., an anode) of the light-emitting diode LED may be connected to the pixel circuit PC, and a second electrode (e.g., a cathode) of the light-emitting diode LED may be connected to a common voltage line VSL that is configured to provide a common power voltage ELVSS. The light-emitting diode LED may emit light having a brightness corresponding to an amount of current supplied thereto from the pixel circuit PC.

The light-emitting diode LED shown in FIG. 2 may correspond to one of the first to third light-emitting diodes LED1, LED2, and LED3 shown in FIG. 1B, and the pixel circuit PC of FIG. 2 may correspond to one of the first to third pixel circuits PC1, PC2, and PC3 shown above in FIG. 1B. In other words, each of the first to third pixel circuits PC1, PC2, and PC3 shown in FIG. 1B may have the same or substantially the same equivalent circuit structure as that of the pixel circuit PC shown in FIG. 2, such that the light-emitting diode LED shown in FIG. 2 may be a corresponding one of the first to third light-emitting diodes LED1, LED2, and LED3, but the present disclosure is not limited thereto.

The pixel circuit PC may be configured to control the amount of current flowing from the driving power voltage ELVDD to the common power voltage ELVSS through the light-emitting diode LED according to a data signal. The pixel circuit PC may include a first transistor M1, a second transistor M2, a third transistor M3, and a storage capacitor Cst.

Each of the first transistor M1, the second transistor M2, and the third transistor M3 may be an oxide semiconductor thin-film transistor including a semiconductor layer including an oxide semiconductor, or a silicon semiconductor thin-film transistor including a semiconductor layer including polycrystalline silicon. A first electrode of a transistor may be one of a source electrode and a drain electrode, and a second electrode thereof may be the other of the source electrode and the drain electrode, which depends on a kind of the transistor.

The first transistor M1 may be a driving transistor. A first electrode of the first transistor M1 may be connected to a driving voltage line VDL configured to supply the driving power voltage ELVDD, and a second electrode of the first transistor M1 may be connected to the first electrode of the light-emitting diode LED. A gate electrode of the first transistor M1 may be connected to a first node N1. The first transistor M1 may be configured to control the amount of current flowing from the driving power voltage ELVDD to the light-emitting diode LED according to a voltage of the first node N1.

The second transistor M2 may be a switching transistor. A first electrode of the second transistor M2 may be connected to a data line DL, and a second electrode of the second transistor M2 may be connected to the first node N1. A gate electrode of the second transistor M2 may be connected to a scan line SL. The second transistor M2 may be turned on when a scan signal is supplied to the scan line SL, and may electrically connect the data line DL to the first node N1.

The third transistor M3 may be an initialization transistor and/or a sensing transistor. A first electrode of the third transistor M3 may be connected to a second node N2, and a second electrode of the third transistor M3 may be connected to a sensing line ISL. A gate electrode of the third transistor M3 may be connected to a control line CL.

The third transistor M3 may be turned on when a control signal is supplied to the control line CL, and may electrically connect the sensing line ISL to the second node N2. In an embodiment, the third transistor M3 may be turned on according to the control signal transferred through the control line CL, and may initialize the first electrode of the light-emitting diode LED to an initialization voltage from the sensing line ISL. In an embodiment, the third transistor M3 may be turned on when a control signal is supplied through the control line CL, and may sense characteristic information of the light-emitting diode LED. The third transistor M3 may have both a function of the initialization transistor and a function of the sensing transistor, or may have one from among these functions.

In an embodiment, an initialization operation and a sensing operation of the third transistor M3 may be performed individually from each other, or may be performed concurrently (e.g., simultaneously) with each other. Hereinafter, for convenience of description, a case where the third transistor M3 has both the function of the initialization transistor and the function of the sensing transistor is described in more detail, but the present disclosure is not limited thereto.

The storage capacitor Cst may be connected between the first node N1 and the second node N2. As an example, a first capacitor electrode of the storage capacitor Cst may be connected to the gate electrode of the first transistor M1 (e.g., via the first node N1), and a second capacitor electrode of the storage capacitor Cst may be connected to the first electrode of the light-emitting diode LED (e.g., via the second node N2).

While FIG. 2 shows that the first transistor M1, the second transistor M2, and the third transistor M3 are N-channel metal oxide semiconductor (NMOS) transistors, the present disclosure is not limited thereto. As an example, at least one of the first transistor M1, the second transistor M2, and the third transistor M3 may be a P-channel metal oxide semiconductor (PMOS) transistor. In addition, although FIG. 2 shows that the pixel circuit PC includes three transistors, the present disclosure is not limited thereto. For example, the pixel circuit PC may include four or more transistors.

Figure 3:
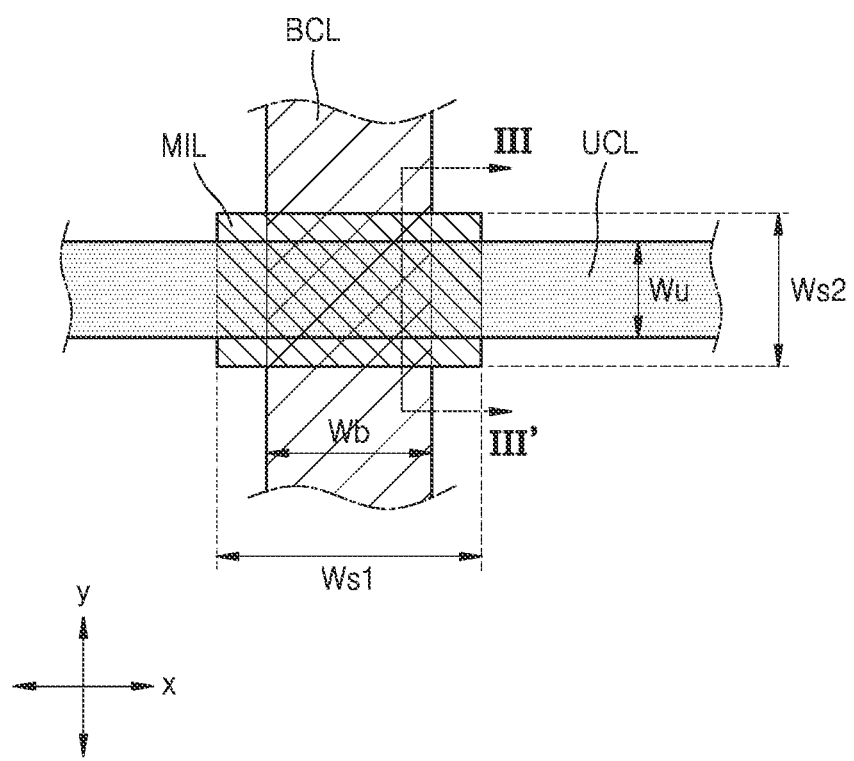
FIG. 3 is a plan view of a portion of a pixel circuit according to an embodiment.
Figure 4:
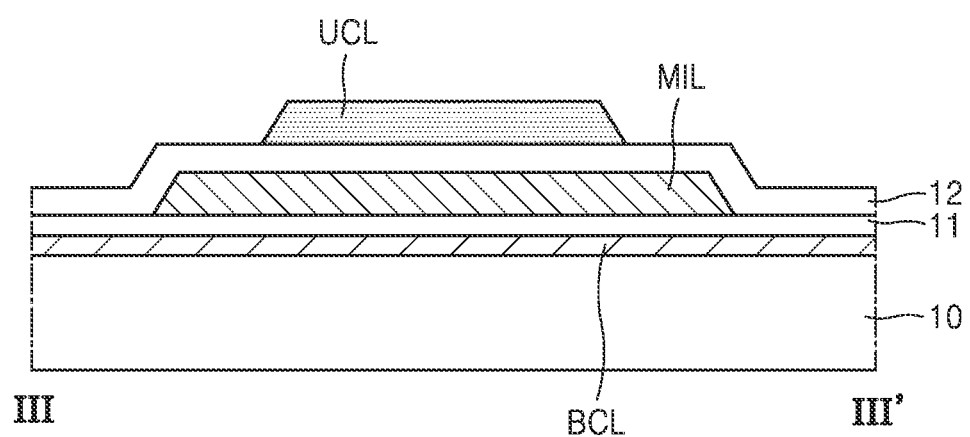
FIG. 4 is a cross-sectional view of the pixel circuit taken along the line III-III' of FIG. 3.

FIG. 3 is a plan view of a portion of a pixel circuit according to an embodiment. FIG. 3 shows a bottom conductive layer BCL, an upper conductive layer UCL, and an intermediate layer MIL. FIG. 4 is a cross-sectional view of the pixel circuit taken along the line III-III' of FIG. 3.

Referring to FIG. 3, the bottom conductive layer BCL may cross the upper conductive layer UCL located thereon. As an example, the bottom conductive layer BCL may extend in a y-direction, and the upper conductive layer UCL may extend in an x-direction crossing the y-direction. The bottom conductive layer BCL and the upper conductive layer UCL may include (e.g., may be) various wirings, which are described above with reference to FIG. 2. The bottom conductive layer BCL and the upper conductive layer UCL may each include a conductive material. The bottom conductive layer BCL and the upper conductive layer UCL may each include at least one of molybdenum (Mo), copper (Cu), titanium (Ti), and the like, and may have a single-layer structure or a multi-layered structure including one or more of the above materials.

The intermediate layer MIL may overlap with a crossing region (e.g., an intersection region) where the bottom conductive layer BCL crosses the upper conductive layer UCL. The intermediate layer MIL may entirely cover an overlapping region where the bottom conductive layer BCL crosses and overlaps with the upper conductive layer UCL.

An area of the intermediate layer MIL may be greater than an area of the overlapping region. The intermediate layer MIL may be provided as a pattern having a first width Ws1 in the x-direction and a second width Ws2 in the y-direction. In other words, the intermediate layer MIL may have an isolated shape in a plan view. The first width Ws1 of the intermediate layer MIL may be greater than a width Wb of the bottom conductive layer BCL in the x-direction. The second width Ws2 of the intermediate layer MIL may be greater than a width Wu of the upper conductive layer UCL in the y-direction. The intermediate layer MIL may cover a portion where the edge of the bottom conductive layer BCL crosses the edge of the upper conductive layer UCL. The edge of the intermediate layer MIL may be spaced apart by about 2 μm to about 3 μm from the edge of the bottom conductive layer BCL and/or the edge of the upper conductive layer UCL. Although FIG. 3 shows that the intermediate layer MIL has a quadrangular shape, the present disclosure is not limited thereto, and the intermediate layer MIL may have various suitable shapes, for example, such as a quadrangle having rounded edges and/or corners, a polygon other than the quadrangle, a circular shape, an elliptical shape, and/or the like.

Referring to FIG. 4, the bottom conductive layer BCL may be arranged on the first substrate 10, and the upper conductive layer UCL may be arranged thereover. The intermediate layer MIL may be arranged between the bottom conductive layer BCL and the upper conductive layer UCL.

The intermediate layer MIL may be arranged over the bottom conductive layer BCL with a first insulating layer 11 therebetween. A second insulating layer 12 may be arranged on the intermediate layer MIL. The intermediate layer MIL may be arranged below the upper conductive layer UCL with the second insulating layer 12 therebetween.

The first insulating layer 11 and the second insulating layer 12 may each include an inorganic insulating material, for example, such as silicon nitride, silicon oxide, and/or silicon oxynitride. In addition, the first insulating layer 11 and the second insulating layer 12 may include an organic insulating material, for example, such as a general-purpose polymer, polymer derivatives having a phenol-based group, an acryl-based polymer, an imide-based polymer, an aryl ether-based polymer, an amide-based polymer, a fluorine-based polymer, a p-xylene-based polymer, and/or a vinyl alcohol-based polymer. The first insulating layer 11 and the second insulating layer 12 may have a single-layer structure or a multi-layered structure including one or more of the above materials.

The intermediate layer MIL may include a material different from that of the first insulating layer 11 and the second insulating layer 12. In an embodiment, the intermediate layer MIL may include a conductive material. The intermediate layer MIL may include at least one of molybdenum (Mo), copper (Cu), titanium (Ti), and the like, and may have a single-layer structure or a multi-layered structure including one or more of the above materials. In another embodiment, the intermediate layer MIL may include a semiconductor material. The intermediate layer MIL may include an oxide-based semiconductor material or a silicon-based semiconductor material (e.g., amorphous silicon and/or polycrystalline silicon).

The intermediate layer MIL may prevent or substantially prevent the bottom conductive layer BCL and the upper conductive layer UCL from being short-circuited. When the intermediate layer MIL is not provided, in a case where cracks occur or foreign materials are formed in an insulating layer arranged between the bottom conductive layer BCL and the upper conductive layer UCL, the bottom conductive layer BCL and the upper conductive layer UCL may be short-circuited. According to one or more embodiments, because the intermediate layer MIL may be formed between the bottom conductive layer BCL and the upper conductive layer UCL, even though cracks may occur in the first insulating layer 11 or the second insulating layer 12, the bottom conductive layer BCL and the upper conductive layer UCL may be prevented or substantially prevented from being short-circuited.

In addition, the intermediate layer MIL may serve as a shield layer for preventing or substantially preventing coupling between a constant voltage or a signal applied to the bottom conductive layer BCL and a constant voltage or a signal applied to the upper conductive layer UCL.

Figure 5:
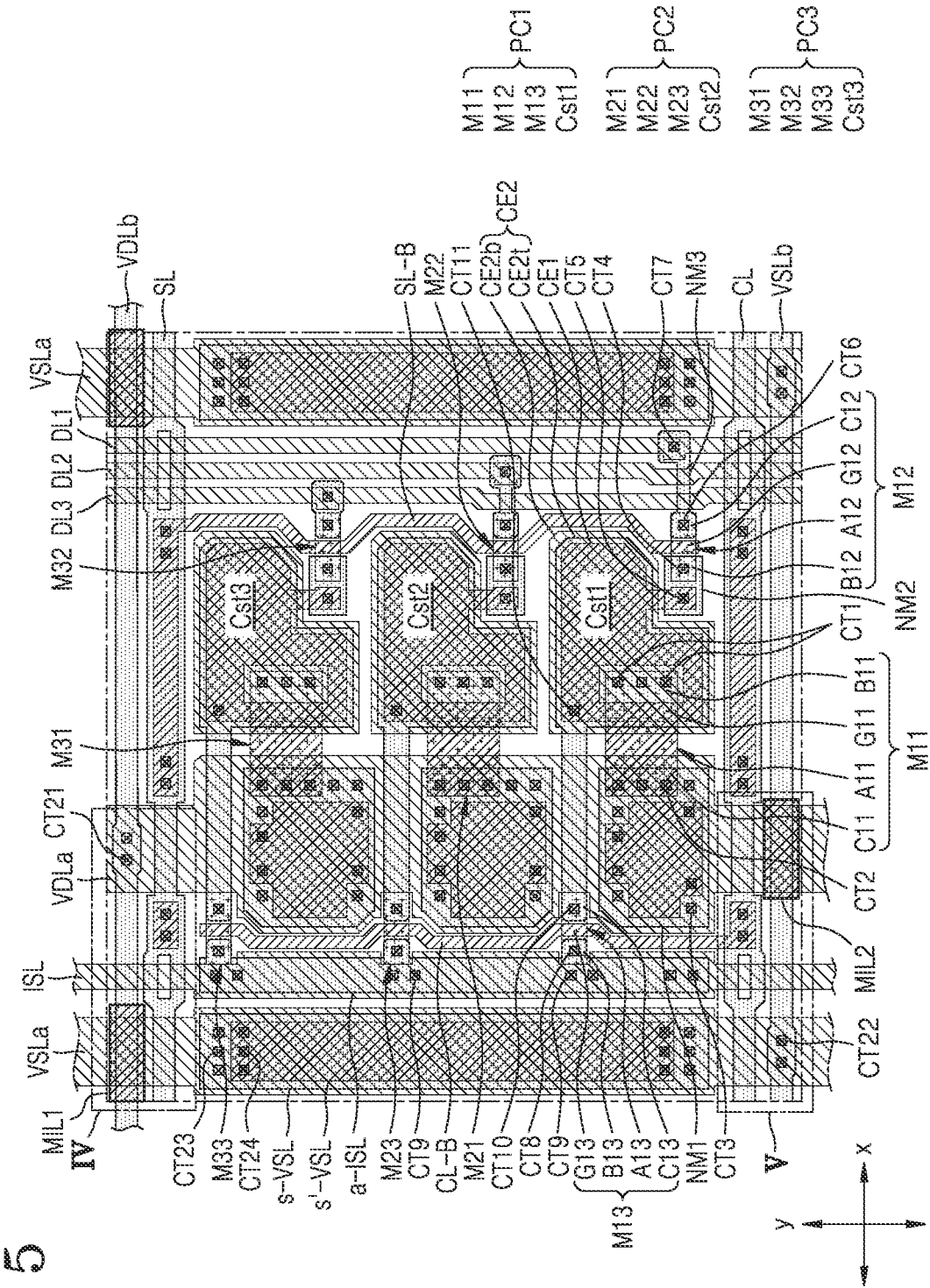
FIG. 5 is a plan view of pixel circuits of a light-emitting panel according to an embodiment.
Figure 6A:
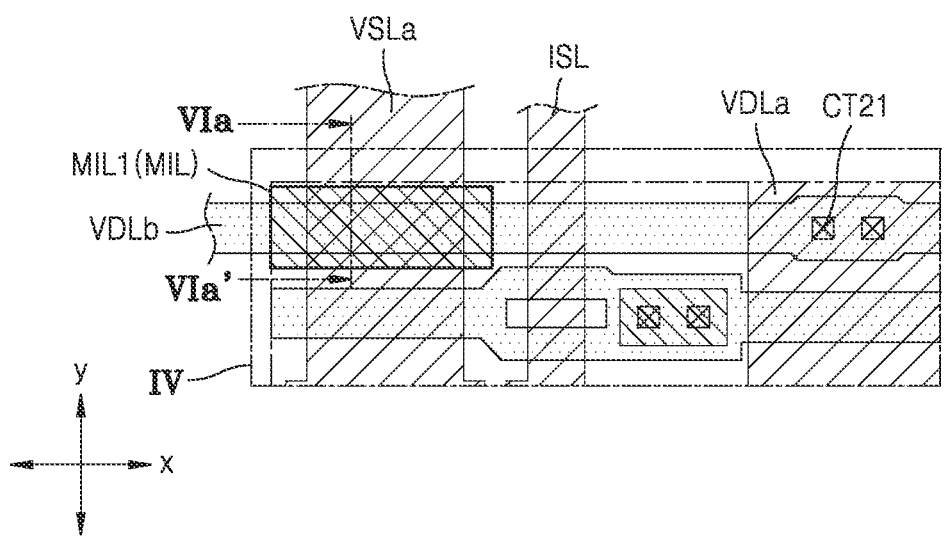
FIG. 6A is an enlarged plan view of the region IV of FIG. 5.
Figure 6B:
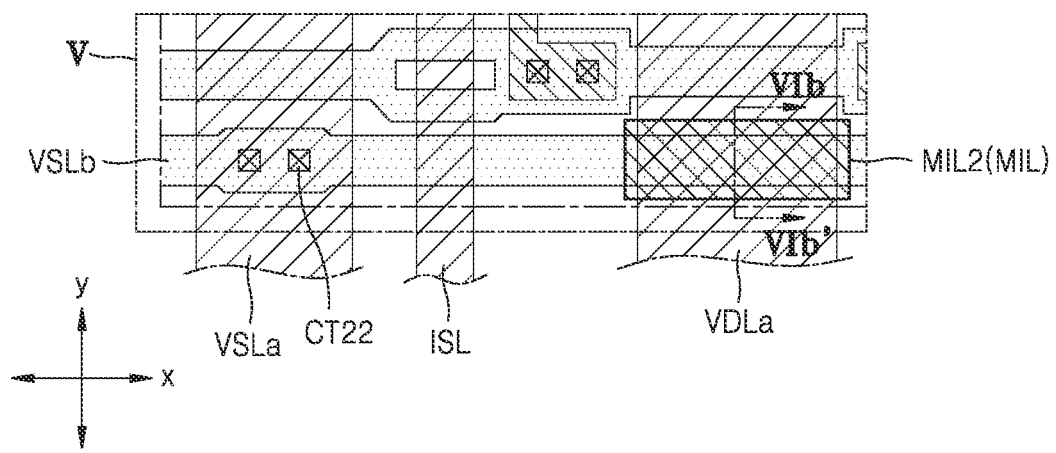
FIG. 6B is an enlarged plan view of the region V of FIG. 5.
Figure 7:
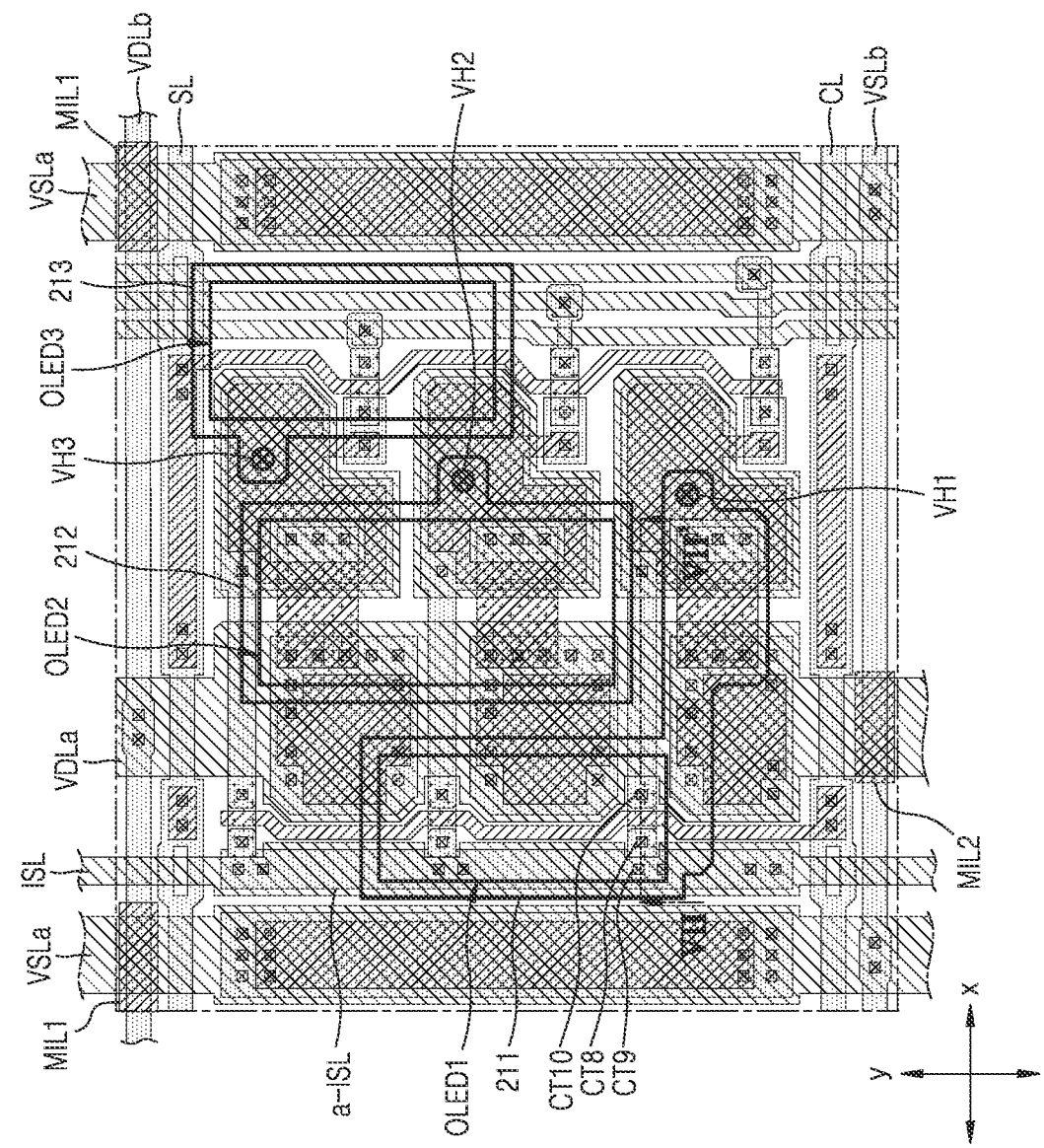
FIG. 7 is a plan view of light-emitting diodes arranged over the pixel circuits of FIG. 5.

FIG. 5 is a plan view of pixel circuits of a light-emitting panel according to an embodiment, FIG. 6A is an enlarged plan view of the region IV of FIG. 5, and FIG. 6B is an enlarged plan view of the region V of FIG. 5. FIG. 7 is a plan view of light-emitting diodes arranged over the pixel circuits of FIG. 5. FIG. 7 illustrates an embodiment where a light-emitting diode is an organic light-emitting diode, but the present disclosure is not limited thereto.

Referring to FIG. 5, the scan line SL and the control line CL may extend in the x-direction, and each of first to third data lines DL1, DL2, and DL3 may extend in the y-direction crossing the x-direction. In addition, the sensing line ISL, a first driving voltage line VDLa, and a first common voltage line VSLa may each extend in the y-direction, and a second driving voltage line VDLb and a second common voltage line VSLb may each extend in the x-direction.

Two first common voltage lines VSLa that are adjacent to each other may be spaced apart from each other. The first to third data lines DL1, DL2, and DL3, the sensing line ISL, and the first driving voltage line VDLa may be arranged between the two first common voltage lines VSLa that are adjacent to each other. The sensing line ISL and the first driving voltage line VDLa that are adjacent to each other may be adjacent to one of the two first common voltage lines VSLa. The first to third data lines DL1, DL2, and DL3 that are adjacent to each other may be adjacent to the other of the two first common voltage lines VSLa. As an example, the sensing line ISL and the first driving voltage line VDLa may be arranged at (e.g., in or on) one side (e.g., a left side) of first to third storage capacitors Cst1, Cst2, and Cst3 described in more detail below. The first to third data lines DL1, DL2, and DL3 may be arranged at (e.g., in or on) another side (e.g., a right side) of the first to third storage capacitors Cst1, Cst2, and Cst3. Through this structure, a space of the light-emitting panel may be more efficiently used.

The second driving voltage line VDLb and the second common voltage line VSLb may extend in the x-direction to cross the first common voltage line VSLa and the first driving voltage line VDLa. The second driving voltage line VDLb and the second common voltage line VSLb may be spaced apart from each other with the first to third storage capacitors Cst1, Cst2, and Cst3 therebetween.

The second driving voltage line VDLb may be adjacent to the scan line SL, and the second common voltage line VSLb may be adjacent to the control line CL. The second driving voltage line VDLb may be connected to the first driving voltage line VDLa through a contact hole CT21. The second common voltage line VSLb may be connected to the first common voltage line VSLa through a contact hole CT22.

The light-emitting panel may include a structure in which the structure shown in FIG. 5 is repeated in the x-direction and the y-direction. Accordingly, the plurality of first driving voltage lines VDLa and the plurality of second driving voltage lines VDLb provided to the light-emitting panel may constitute a mesh structure in a plan view. Likewise, the plurality of first common voltage lines VSLa and the plurality of second common voltage lines VSLb may constitute a mesh structure in a plan view.

The first common voltage line VSLa may overlap with a first sub-common voltage line s-VSL and a second sub-common voltage line s'-VSL. The first common voltage line VSLa may be electrically connected to the first sub-common voltage line s-VSL and the second sub-common voltage line s'-VSL. As an example, the first common voltage line VSLa may be connected to the first sub-common voltage line s-VSL through a contact hole CT23, and the first common voltage line VSLa may be connected to the second sub-common voltage line s'-VSL through a contact hole CT24. The first sub-common voltage line s-VSL and the second sub-common voltage line s'-VSL may be arranged at (e.g., in or on) different layers from each other.

The first sub-common voltage line s-VSL and the second sub-common voltage line s'-VSL may be arranged between the scan line SL and the control line CL, and may have a length that is less than a separation distance (e.g., in the y-direction) between the scan line SL and the control line CL. The first sub-common voltage line s-VSL and the second sub-common voltage line s'-VSL may be formed to reduce a self-resistance of the first common voltage line VSLa, and may be arranged at (e.g., in or on) the same layer as those of the gate electrode of the transistor and/or the scan line SL.

Transistors and storage capacitors may be arranged in an approximately quadrangular space surrounded (e.g., around peripheries thereof) by the first common voltage lines VSLa, the second driving voltage line VDLb, and the second common voltage line VSLb that are adjacent to each other in a plan view. The transistors and storage capacitors may each be electrically connected to a corresponding light-emitting diode. For example, FIG. 7 shows that first electrodes 211, 212, and 213 of the first to third organic light-emitting diodes OLED1, OLED2, and OLED3 are electrically connected to corresponding pixel circuits, respectively.

The first electrode 211 of the first organic light-emitting diode OLED1 may be electrically connected to the first pixel circuit PC1. As shown in FIG. 5, the first pixel circuit PC1 may include a first driving transistor M11, a first switching transistor M12, a first sensing transistor M13, and a first storage capacitor Cst1.

The first electrode 212 of the second organic light-emitting diode OLED2 may be electrically connected to the second pixel circuit PC2. The second pixel circuit PC2 may include a second driving transistor M21, a second switching transistor M22, a second sensing transistor M23, and a second storage capacitor Cst2.

The first electrode 213 of the third organic light-emitting diode OLED3 may be electrically connected to the third pixel circuit PC3. The third pixel circuit PC3 may include a third driving transistor M31, a third switching transistor M32, a third sensing transistor M33, and a third storage capacitor Cst3.

The first to third storage capacitors Cst1, Cst2, and Cst3 may be arranged along the y-direction. The first storage capacitor Cst1 may be relatively closest to the control line CL, the third storage capacitor Cst3 may be relatively closest to the scan line SL, and the second storage capacitor Cst2 may be arranged between the first storage capacitor Cst1 and the third storage capacitor Cst3.

The first driving transistor M11 may include a first driving semiconductor layer A11 and a first driving gate electrode G11. The first driving semiconductor layer A11 may include an oxide semiconductor or a silicon-based semiconductor. The first driving semiconductor layer A11 may include a first low-resistance region B11 and a second low-resistance region C11. A first channel region may be arranged between the first low-resistance region B11 and the second low-resistance region C11. The first low-resistance region B11 and the second low-resistance region C11 may be regions having a lower resistance than that of the first channel region, and may be formed by an impurity-doping process or a conductive process. The first driving gate electrode G11 may overlap with the first channel region of the first driving semiconductor layer A11. One of the first low-resistance region B11 and the second low-resistance region C11 may correspond to a source region, and the other thereof may correspond to a drain region.

One of the first low-resistance region B11 and the second low-resistance region C11 of the first driving semiconductor layer A11 may be connected to the first storage capacitor Cst1, and the other thereof may be connected to the first driving voltage line VDLa. As an example, the first low-resistance region B11 may be connected to a portion of the second capacitor electrode CE2 (e.g., a second sub-electrode CE2t of the second capacitor electrode CE2) of the first storage capacitor Cst1 through a first contact hole CT1. The second low-resistance region C11 may be connected to a first connector NM1 through a second contact hole CT2, and the first connector NM1 may be connected to the first driving voltage line VDLa through a third contact hole CT3. In other words, the second low-resistance region C11 may be electrically connected to the first driving voltage line VDLa through the first connector NM1.

The first switching transistor M12 may include a first switching semiconductor layer A12 and a first switching gate electrode G12. The first switching semiconductor layer A12 may include an oxide semiconductor or a silicon-based semiconductor. The first switching semiconductor layer A12 may include a first low-resistance region B12 and a second low-resistance region C12. A second channel region may be arranged between the first low-resistance region B12 and the second low-resistance region C12. The first switching gate electrode G12 may overlap with the second channel region of the first switching semiconductor layer A12. The first switching gate electrode G12 may correspond to a portion of the scan line SL, for example, such as a portion of a branch (e.g., also referred to as a first branch SL-B) extending in a direction (e.g., the y-direction) crossing the scan line SL.

The scan line SL may include the gate electrodes of the first to third switching transistors M12, M22, and M32. As an example, the scan line SL may include the first branch SL-B extending in the y-direction. Portions of the first branch SL-B may correspond to the gate electrodes of the first to third switching transistors M12, M22, and M32. The first branch SL-B may extend between a group of the first to third storage capacitors Cst1, Cst2, and Cst3 and a group of the first to third data lines DL1, DL2, and DL3.

One of the first low-resistance region B12 and the second low-resistance region C12 of the first switching semiconductor layer A12 may be electrically connected to the first data line DL1, and the other thereof may be electrically connected to the first storage capacitor Cst1. As an example, the first low-resistance region B12 may be connected to a second connector NM2 through a fourth contact hole CT4, and the second connector NM2 may be connected to a first capacitor electrode CE1 of the first storage capacitor Cst1 through a fifth contact hole CT5. Accordingly, the first low-resistance region B12 may be electrically connected to the first capacitor electrode CE1 of the first storage capacitor Cst1 by the second connector NM2. The second low-resistance region C12 may be connected to a third connector NM3 through a sixth contact hole CT6, and the third connector NM3 may be connected to the first data line DL1 through a seventh contact hole CT7. The second low-resistance region C12 may be connected to the first data line DL1 by the third connector NM3.

The first sensing transistor M13 may include a first sensing semiconductor layer A13 and a first sensing gate electrode G13. The first sensing semiconductor layer A13 may include an oxide semiconductor or a silicon-based semiconductor. The first sensing semiconductor layer A13 may include a first low-resistance region B13 and a second low-resistance region C13. A third channel region may be arranged between the first low-resistance region B13 and the second low-resistance region C13. The first sensing gate electrode G13 may overlap with the third channel region of the first sensing semiconductor layer A13.

The control line CL may include the gate electrodes of the first to third sensing transistors M13, M23, and M33. As an example, the control line CL may include a branch (e.g., also referred to as a second branch CL-B) extending in the y-direction. Portions of the second branch CL-B may correspond to the gate electrodes of the first to third sensing transistors M13, M23, and M33. The second branch CL-B may extend between the first driving voltage line VDLa and the sensing line ISL.

One of the first low-resistance region B13 and the second low-resistance region C13 of the first sensing semiconductor layer A13 may be electrically connected to the sensing line ISL, and the other thereof may be electrically connected to the first storage capacitor Cst1. As an example, the first low-resistance region B13 may be connected to an auxiliary sensing line a-ISL through an eighth contact hole CT8, and the auxiliary sensing line a-ISL may be connected to the sensing line ISL through a ninth contact hole CT9. Accordingly, the first low-resistance region B13 may be electrically connected to the sensing line ISL through the auxiliary sensing line a-ISL. The auxiliary sensing line a-ISL may extend in an extension direction (e.g., the y-direction) of the sensing line ISL while overlapping with the sensing line ISL. In a plan view, the auxiliary sensing line a-ISL may be arranged between the scan line SL and the control line CL, and may have a length less than a separation distance (e.g., in the y-direction) between the scan line SL and the control line CL. The second low-resistance region C13 may be electrically connected to a portion of the second capacitor electrode CE2 of the first storage capacitor Cst1, for example, such as the second sub-electrode CE2$t$ of the second capacitor electrode CE2, through a tenth contact hole CT10.

The first storage capacitor Cst1 may include at least two electrodes. In an embodiment, the first storage capacitor Cst1 may include the first capacitor electrode CE1 and the second capacitor electrode CE2.

The first capacitor electrode CE1 may be formed as one body with the first driving gate electrode G11. In other words, a portion of the first capacitor electrode CE1 may include the first driving gate electrode G11. The first capacitor electrode CE1 may include an opening formed therein, and the first contact hole CT1 may be arranged in the opening.

The second capacitor electrode CE2 may include a first sub-electrode CE2$b$ and a second sub-electrode CE2$t$. The first sub-electrode CE2$b$ may be under the first capacitor electrode CE1, and the second sub-electrode CE2$t$ may be on the first capacitor electrode CE1. The first sub-electrode CE2$b$ may be connected to the second sub-electrode CE2$t$ through an eleventh contact hole CT11.

The structures and materials of the second driving transistor M21 and the third driving transistor M31 may be the same or substantially the same as those of the first driving transistor M11 described above. The second switching transistor M22 and the third switching transistor M32 may be the same or substantially the same as the first switching transistor M12 described above, except that the second switching transistor M22 and the third switching transistor M32 may be connected to the second data line DL2 and the third data line DL3, respectively. The structures and materials of the second sensing transistor M23 and the third sensing transistor M33 may be the same or substantially the same as those of the first sensing transistor M13 described above. The structures of the second storage capacitor Cst2 and the third storage capacitor Cst3 may be the same or substantially the same as that of the first storage capacitor Cst1 described above. Accordingly, redundant description thereof may not be repeated.

Referring to FIGS. 6A and 6B, the intermediate layer MIL may be arranged at (e.g., in or on) a region where the first common voltage line VSLa crosses the second driving voltage line VDLb, and/or at (e.g., in or on) a region where the first driving voltage line VDLa crosses the second common voltage line VSLb. The intermediate layer MIL may include a first intermediate layer MIL1 (e.g., see FIG. 6A) and a second intermediate layer MIL2 (e.g., see FIG. 6B).

The first intermediate layer M ILI may be arranged at (e.g., in or on) a region where the first common voltage line VSLa crosses the second driving voltage line VDLb. The first common voltage line VSLa may be arranged below the first intermediate layer MIL1, and may extend in the y-direction. An insulating layer may be arranged between the first common voltage line VSLa and the first intermediate layer MIL1. The first common voltage line VSLa may be the bottom conductive layer BCL described above with reference to FIG. 3.

The second driving voltage line VDLb may be arranged over the first intermediate layer MIL1, and may extend in the x-direction. The second driving voltage line VDLb may be connected to the first driving voltage line VDLa through a contact hole CT21, and the first driving voltage line VDLa may extend in the y-direction. An insulating layer may be arranged between the second driving voltage line VDLb and the first intermediate layer MIL1. The second driving voltage line VDLb may be the upper conductive layer UCL described above with reference to FIG. 3.

The first intermediate layer MIL1 may entirely cover an overlapping region where the first common voltage line VSLa crosses and overlaps with the second driving voltage line VDLb. An area of the first intermediate layer MIL1 may be greater than an area of the overlapping region.

Because the first intermediate layer MIL1 is arranged, even though there may be particles or cracks occurring in a region where the first common voltage line VSLa crosses the second driving voltage line VDLb, the first common voltage line VSLa and the second driving voltage line VDLb may be prevented or substantially prevented from being short-circuited. In addition, because the first intermediate layer MIL1 may shield between the first common voltage line VSLa and the second driving voltage line VDLb that provide different voltages or signals from each other, a stable voltage and/or signal may be provided to the light-emitting panel.

The second intermediate layer MIL2 may be arranged at (e.g., in or on) a region where the first driving voltage line VDLa crosses the second common voltage line VSLb. The first driving voltage line VDLa may be arranged below the second intermediate layer MIL2, and may extend in the y-direction. An insulating layer may be arranged between the first driving voltage line VDLa and the second intermediate layer MIL2. The first driving voltage line VDLa may be the bottom conductive layer BCL described above with reference to FIG. 3.

The second common voltage line VSLb may be arranged over the second intermediate layer MIL2, and may extend in the x-direction. The second common voltage line VSLb may be connected to the first common voltage line VSLa through a contact hole CT22, and the first common voltage line VSLa may extend in the y-direction. An insulating layer may be arranged between the second common voltage line VSLb and the second intermediate layer MIL2. The second common voltage line VSLb may be the upper conductive layer UCL described above with reference to FIG. 3.

The second intermediate layer MIL2 may entirely cover an overlapping region where the first driving voltage line VDLa crosses and overlaps with the second common voltage line VSLb. An area of the second intermediate layer MIL2 may be greater than an area of the overlapping region.

Because the second intermediate layer MIL2 is arranged, even though there may be particles or cracks occurring in a region where the first driving voltage line VDLa crosses the second common voltage line VSLb, the first driving voltage line VDLa and the second common voltage line VSLb may be prevented or substantially prevented from being short-circuited. In addition, because the second intermediate layer MIL2 may shield between the first driving voltage line VDLa and the second common voltage line VSLb that provide different voltages or signals from each other, a stable voltage and/or signal may be provided to the light-emitting panel.

As shown in FIG. 7, the first organic light-emitting diode OLED1 may be electrically connected to the first pixel circuit PC1 through a first via hole VH1. As an example, the first electrode 211 of the first organic light-emitting diode OLED1 may be connected to the second sub-electrode CE2t (e.g., see FIG. 5) of the first storage capacitor Cst1 through the first via hole VH1.

As shown in FIG. 7, the second organic light-emitting diode OLED2 may be electrically connected to the second pixel circuit PC2 through a second via hole VH2. As an example, the first electrode 212 of the second organic light-emitting diode OLED2 may be connected to the second sub-electrode of the second storage capacitor Cst2 through the second via hole VH2.

As shown in FIG. 7, the third organic light-emitting diode OLED3 may be electrically connected to the third pixel circuit PC3 through a third via hole VH3. As an example, the first electrode 213 of the third organic light-emitting diode OLED3 may be connected to the second sub-electrode of the third storage capacitor Cst3 through the third via hole VH3.

Figure 8:
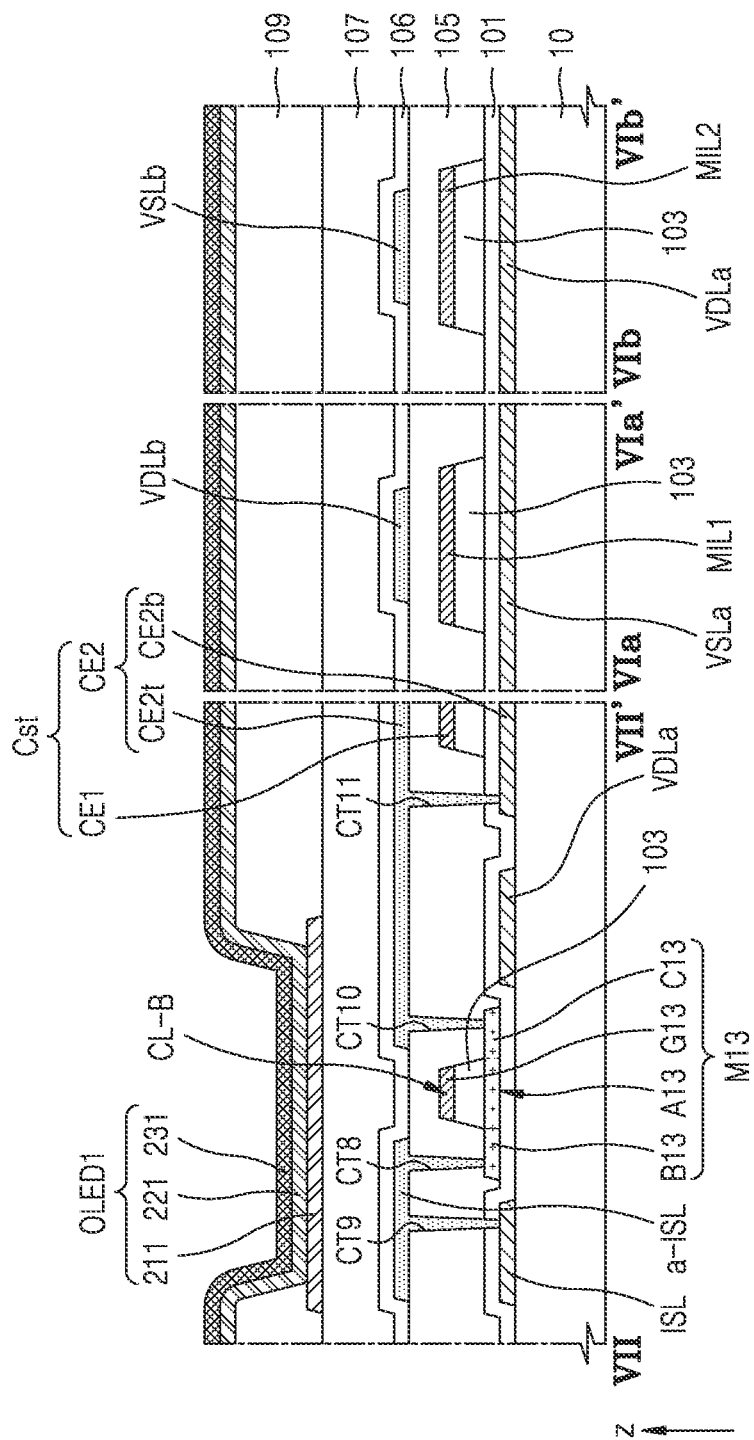
FIG. 8 shows cross-sectional views of a portion of the light-emitting panel taken along the line VIa-VIa' of FIG. 6A, the line VIb-VIb' of FIG. 6B, and the line VII-VII' of FIG. 7.

FIG. 8 shows cross-sectional views of a portion of the light-emitting panel taken along the line VIa-VIa' of FIG. 6A, the line VIb-VIb' of FIG. 6B, and the line VII-VII' of FIG. 7.

The first substrate 10 may include glass or a resin material. The glass may include transparent glass including $SiO_2$ as a main component. The resin material may include a polymer resin including polyethersulfone, polyacrylate, polyetherimide, polyethylene naphthalate, polyethylene terephthalate, polyphenylene sulfide, polyarylate, polyimide, polycarbonate, cellulose tri acetate, cellulose acetate propionate, and/or the like. In the case where the first substrate 10 includes the polymer resin, the first substrate 10 may be flexible, rollable, and/or bendable.

The sensing line ISL, the first common voltage line VSLa, and the first driving voltage line VDLa may be arranged on the first substrate 10. The sensing line ISL, the first common voltage line VSLa, and the first driving voltage line VDLa may include a metal, for example, such as molybdenum (Mo), copper (Cu), and/or titanium (Ti). The sensing line ISL, the first common voltage line VSLa, and the first driving voltage line VDLa may be directly arranged on the first substrate 10, and may directly contact the first substrate 10. However, the present disclosure is not limited thereto, and an insulating layer may be arranged between the first substrate 10 and the sensing line ISL, the first common voltage line VSLa, and the first driving voltage line VDLa.

A buffer layer 101 may be arranged on the sensing line ISL, the first common voltage line VSLa, and the first driving voltage line VDLa. A semiconductor layer may be arranged on the buffer layer 101. For example, FIG. 8 shows for convenience of illustration that the first sensing semiconductor layer A13 of the first sensing transistor M13 may be arranged on the buffer layer 101. However, the present disclosure is not limited thereto, and all of the semiconductor layers of the other transistors described above may be arranged on the buffer layer 101.

The buffer layer 101 may prevent or substantially prevent impurities from penetrating to the semiconductor layers. The buffer layer 101 may include an inorganic insulating material, for example, such as silicon nitride, silicon oxide, and/or silicon oxynitride.

A gate insulating layer 103 is formed on the semiconductor layer. For example, as shown in FIG. 8, the gate insulating layer 103 may be arranged on the first sensing semiconductor layer A13. The gate insulating layer 103 may include an inorganic insulating material, for example, such as silicon nitride, silicon oxide, and/or silicon oxynitride, or may include an organic insulating material. The gate insulating layer 103 may have a single-layer structure or a multi-layered structure including one or more of the above materials. The gate insulating layer 103 may be patterned along the shape of a conductive layer arranged thereon. As an example, the gate insulating layer 103 may be patterned in the same or substantially the same shape as the shape of the first sensing gate electrode G13 arranged thereon. Accordingly, a lateral surface of the gate insulating layer 103 may correspond to (e.g., may meet) a lateral surface of the first sensing gate electrode G13.

A gate electrode may overlap with the channel region of a semiconductor layer corresponding thereto. For example, as shown in FIG. 8, the first sensing gate electrode G13 may overlap with the channel region of the first sensing semiconductor layer A13 with the gate insulating layer 103 therebetween. The first sensing semiconductor layer A13 may include the channel region, a first low-resistance region B13, and a second low-resistance region C13. The channel region may overlap with the first sensing gate electrode G13, and the first low-resistance region B13 and the second low-resistance region C13 may be located at (e.g., in or on) two opposite sides of the channel region, respectively. The first sensing gate electrode G13 may include at least one of molybdenum (Mo), copper (Cu), titanium (Ti), and the like, and may have a single-layer structure or a multi-layered structure including one or more of the above materials.

An interlayer insulating layer 105 may be formed on the gate electrode. For example, as shown in FIG. 8, the interlayer insulating layer 105 may be formed on the first sensing gate electrode G13. The interlayer insulating layer 105 may include an inorganic insulating material, for example, such as silicon nitride, silicon oxide, and/or silicon oxynitride, or may include an organic insulating material.

The auxiliary sensing line a-ISL may be arranged on the interlayer insulating layer 105, and may be electrically connected to the sensing line ISL through a ninth contact hole CT9 passing through (e.g., penetrating) the interlayer insulating layer 105. Because the auxiliary sensing line a-ISL is electrically connected to the sensing line ISL while having a suitable length (e.g., a preset or predetermined length), a local voltage drop due to a resistance of the sensing line ISL may be prevented or reduced. A portion of the auxiliary sensing line a-ISL may be electrically connected to a sensing semiconductor layer through a contact hole passing through (e.g., penetrating) the interlayer insulating layer 105. For example, as shown in FIG. 8, the auxiliary sensing line a-ISL may be connected to the first low-resistance region B13 of the first sensing semiconductor layer A13 through an eighth contact hole CT8. The second low-resistance region C13 of the first sensing semiconductor layer A13 may be electrically connected to the second capacitor electrode CE2, for example, the second sub-electrode CE2t through a tenth contact hole CT10. The second sub-electrode CE2t may be arranged on the interlayer insulating layer 105.

The auxiliary sensing line a-ISL and the second sub-electrode CE2t may include at least one of molybdenum (Mo), copper (Cu), titanium (Ti), and the like, and may have a single-layer structure or a multi-layered structure including one or more of the above materials.

The first capacitor electrode CE1 of the first storage capacitor Cst1 may include the same or substantially the same material as that of the gate electrode, and be arranged at (e.g., in or on) the same layer as that of the gate electrode. In other words, the first capacitor electrode CE1 may be arranged on the gate insulating layer 103.

The second capacitor electrode CE2 of the first storage capacitor Cst1 may include the first sub-electrode CE2b and the second sub-electrode CE2t. The first sub-electrode CE2b may be under (e.g., underneath) the first capacitor electrode CE1, and the second sub-electrode CE2t may be on (e.g., above) the first capacitor electrode CE1. The first sub-electrode CE2b may be connected to the second sub-electrode CE2t through an eleventh contact hole CT11. The buffer layer 101 and the gate insulating layer 103 may be arranged between the first sub-electrode CE2b and the first capacitor electrode CE1. The interlayer insulating layer 105 may be arranged between the first capacitor electrode CE1 and the second sub-electrode CE2t. The first capacitor electrode CE1, the first sub-electrode CE2b, and the second sub-electrode CE2t may at least partially overlap with each other.

An inorganic protection layer 106 may be arranged on the auxiliary sensing line a-ISL and the second sub-electrode CE2t. The inorganic protection layer 106 may be arranged to protect the conductive layers on the interlayer insulating layer 105, or in other words, the auxiliary sensing line a-ISL, the second sub-electrode CE2t, and the like. The inorganic protection layer 106 may include an inorganic insulating material, for example, such as silicon nitride, silicon oxide, and/or silicon oxynitride.

A via insulating layer 107 may be arranged on the inorganic protection layer 106. The via insulating layer 107 may include an organic insulating material. As an example, the via insulating layer 107 may include a general-purpose polymer, such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a suitable blend thereof.

A first electrode of the light-emitting diode may be arranged on the via insulating layer 107. For example, FIG. 8 shows that the first electrode 211 of the first organic light-emitting diode OLED1 may be arranged on the via insulating layer 107.

A bank layer 109 is arranged on the first electrode 211. The bank layer 109 may include an opening that exposes a portion of the first electrode 211. An emission layer 221 and a second electrode 231 may be arranged to overlap with the first electrode 211 through the opening of the bank layer 109. The first electrode 211 may include a transparent conductive oxide, for example, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first electrode 211 may include a reflective layer including magnesium (Mg), silver (Ag), aluminum (Al), platinum (Pt), palladium (Pd), gold (Au), nickel (Ni), neodymium (Nd), iridium (Ir), chrome (Cr), or a suitable compound thereof. In another embodiment, the first electrode 211 may further include a layer on/under the reflective layer, the layer including ITO, IZO, ZnO, or In₂O₃. In an embodiment, the first electrode 211 may have a three-layered structure of ITO-layer/Ag-layer/ITO-layer that are stacked on one another. Although FIG. 8 shows the first electrode 211 of the first organic light-emitting diode OLED1, the first electrodes 212 and 213 of the second and third organic light-emitting diodes OLED2 and OLED3 may include the same or substantially the same material as that of the first electrode 211 of the first organic light-emitting diode OLED1, and be arranged at (e.g., in or on) the same layer as that of the first electrode 211 of the first organic light-emitting diode OLED1.

The emission layer 221 may include a polymer organic material or a low-molecular weight organic material for emitting blue light. The emission layer 221 may cover the first substrate 10 entirely. As an example, the emission layer 221 may be formed as one body to entirely cover the first to third organic light-emitting diodes OLED1, OLED2, and OLED3 described above with reference to FIG. 7. The second electrode 231 may also cover the first substrate 10 entirely.

The second electrode 231 may be a semi-transmissive electrode or a transmissive electrode. The second electrode 231 may be a semi-transmissive electrode including an ultra-thin film metal including magnesium (Mg), silver (Ag), aluminum (Al), platinum (Pt), palladium (Pd), gold (Au), nickel (Ni), neodymium (Nd), iridium (Ir), chrome (Cr), or a suitable compound thereof. The second electrode 231 may include a transparent conductive oxide, for example, such as indium tin oxide (ITO), indium zinc oxide (IZO), zinc oxide (ZnO), indium oxide (In₂O₃), indium gallium oxide (IGO), or aluminum zinc oxide (AZO).

In the present embodiment, the second driving voltage line VDLb and/or the second common voltage line VSLb may be arranged on the interlayer insulating layer 105. The second driving voltage line VDLb and/or the second common voltage line VSLb may include the same or substantially the same material as that of the second capacitor electrode of the storage capacitor, and may be arranged at (e.g., in or on) the same layer as that of the second capacitor electrode of the storage capacitor. For example, as shown in FIG. 8, the second driving voltage line VDLb and/or the second common voltage line VSLb may be arranged at (e.g., in or on) the same layer as that of the second sub-electrode CE2t of the first storage capacitor Cst1.

The first intermediate layer MIL1 and/or the second intermediate layer MIL2 may be arranged on the gate insulating layer 103. The first intermediate layer MIL1 and/or the second intermediate layer MIL2 may be arranged at (e.g., in or on) the same layer as that of the gate electrode, and may include the same or substantially the same material as that of the gate electrode. For example, as shown in FIG. 8, the first intermediate layer MIL1 and/or the second intermediate layer MIL2 may be arranged at (e.g., in or on) the same layer as that of the first sensing gate electrode G13. The gate insulating layer 103 arranged under the first intermediate layer MIL1 and/or the second intermediate layer MIL2 may be patterned along the shape of the first intermediate layer MIL1 and/or the second intermediate layer MIL2.

The buffer layer 101 and the gate insulating layer 103 may be arranged between the first common voltage line VSLa and the first intermediate layer MIL1. The interlayer insulating layer 105 may be arranged between the first intermediate layer MIL1 and the second driving voltage line VDLb. A width of the first intermediate layer MIL1 may be greater than a width of the second driving voltage line VDLb.

Similarly, the buffer layer 101 and the gate insulating layer 103 may be arranged between the first driving voltage line VDLa and the second intermediate layer MIL2. The interlayer insulating layer 105 may be arranged between the second intermediate layer MIL2 and the second common voltage line VSLb. A width of the second intermediate layer MIL2 may be greater than a width of the second common voltage line VSLb.

Figure 9:
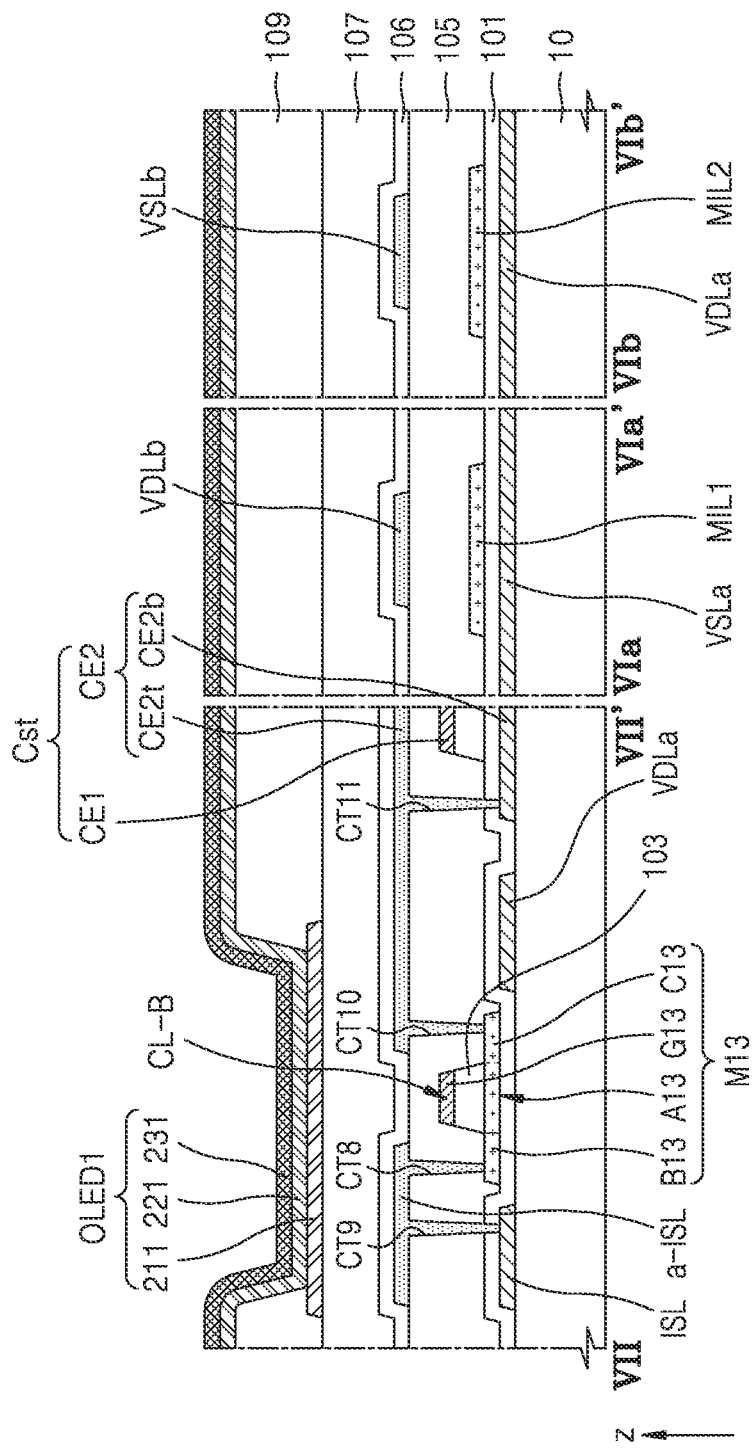
FIG. 9 is a cross-sectional view of a portion of a light-emitting panel according to an embodiment.

FIG. 9 is a cross-sectional view of a portion of a light-emitting panel according to an embodiment. In FIG. 9, the same reference symbols are used to denote the same or substantially the same elements and members as those described above with reference to FIG. 8, and thus, redundant description thereof may not be repeated.

Referring to FIG. 9, the first intermediate layer MIL1 may be arranged between the first common voltage line VSLa and the second driving voltage line VDLb. The second intermediate layer MIL2 may be arranged between the first driving voltage line VDLa and the second common voltage line VSLb.

The first common voltage line VSLa and the first driving voltage line VDLa may be arranged between the first substrate 10 and the buffer layer 101. The second driving voltage line VDLb and/or the second common voltage line VSLb may be arranged on the interlayer insulating layer 105. The second driving voltage line VDLb and/or the second common voltage line VSLb may be arranged at (e.g., in or on) the same layer as that of one electrode of the storage capacitor, and may include the same or substantially the same material as that of the one electrode of the storage capacitor.

In the present embodiment, the first intermediate layer MIL1 and/or the second intermediate layer MIL2 may be arranged on the buffer layer 101. The first intermediate layer MIL1 and/or the second intermediate layer MIL2 may be arranged at (e.g., in or on) the same layer as that of the semiconductor layer, and may include the same or substantially the same material as that of the semiconductor layer. The first intermediate layer MIL1 and/or the second intermediate layer MIL2 may include an oxide semiconductor or a silicon-based semiconductor. For example, as shown in FIG. 9, the first intermediate layer MIL1 and/or the second intermediate layer MIL2 may be arranged at (e.g., in or on) the same layer as that of the first sensing semiconductor layer A13.

The buffer layer 101 may be arranged between the first common voltage line VSLa and the first intermediate layer MIL1. The interlayer insulating layer 105 may be arranged between the first intermediate layer MIL1 and the second driving voltage line VDLb. A width of the first intermediate layer MIL1 may be greater than a width of the second driving voltage line VDLb.

Similarly, the buffer layer 101 may be arranged between the first driving voltage line VDLa and the second intermediate layer MIL2. The interlayer insulating layer 105 may be arranged between the second intermediate layer MIL2 and the second common voltage line VSLb. A width of the second intermediate layer MIL2 may be greater than a width of the second common voltage line VSLb.

Figure 10:
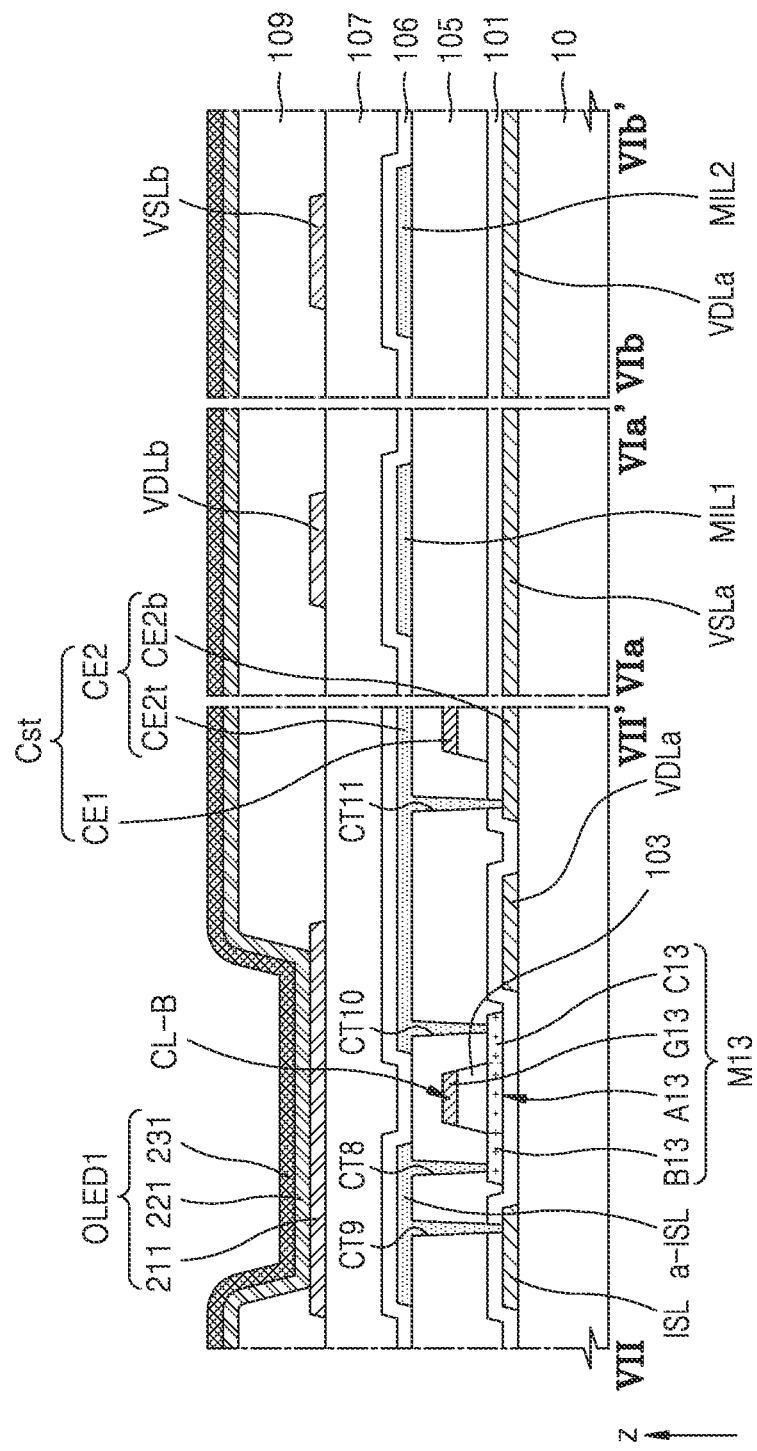
FIG. 10 is a cross-sectional view of a portion of a light-emitting panel according to an embodiment.

FIG. 10 is a cross-sectional view of a portion of a light-emitting panel according to an embodiment. In FIG. 10, the same reference symbols are used to denote the same or substantially the same elements and members as those described above with reference to FIG. 8, and thus, redundant description thereof may not be repeated.

Referring to FIG. 10, the first intermediate layer MIL1 may be arranged between the first common voltage line VSLa and the second driving voltage line VDLb. The second intermediate layer MIL2 may be arranged between the first driving voltage line VDLa and the second common voltage line VSLb.

The first common voltage line VSLa and the first driving voltage line VDLa may be arranged between the first substrate 10 and the buffer layer 101. The second driving voltage line VDLb and/or the second common voltage line VSLb may be arranged on the via insulating layer 107. The second driving voltage line VDLb and/or the second common voltage line VSLb may be arranged at (e.g., in or on) the same layer as that of the first electrode 211 of the first organic light-emitting diode OLED1, and may include the same or substantially the same material as that of the first electrode 211 of the first organic light-emitting diode OLED1.

In the present embodiment, the first intermediate layer MIL1 and/or the second intermediate layer MIL2 may be arranged on the interlayer insulating layer 105. The first intermediate layer MIL1 and/or the second intermediate layer MIL2 may be arranged at (e.g., in or on) the same layer as that of the second capacitor electrode of the storage capacitor, and may include the same or substantially the same material as that of the second capacitor electrode of the storage capacitor. The first intermediate layer MIL1 and/or the second intermediate layer MIL2 may include a metal, for example, such as molybdenum (Mo), copper (Cu), and/or titanium (Ti). For example, as shown in FIG. 10, the first intermediate layer MIL1 and/or the second intermediate layer MIL2 may be arranged at (e.g., in or on) the same layer as that of the second sub-electrode CE2t of the first storage capacitor Cst1.

The buffer layer 101 and the interlayer insulating layer 105 may be arranged between the first common voltage line VSLa and the first intermediate layer MIL1. The inorganic protection layer 106 and the via insulating layer 107 may be arranged between the first intermediate layer MIL1 and the second driving voltage line VDLb. A width of the first intermediate layer MIL1 may be greater than a width of the second driving voltage line VDLb.

Similarly, the buffer layer 101 and the interlayer insulating layer 105 may be arranged between the first driving voltage line VDLa and the second intermediate layer MIL2. The inorganic protection layer 106 and the via insulating layer 107 may be arranged between the second intermediate layer MIL2 and the second common voltage line VSLb. A width of the second intermediate layer MIL2 may be greater than a width of the second common voltage line VSLb.

Figure 11:
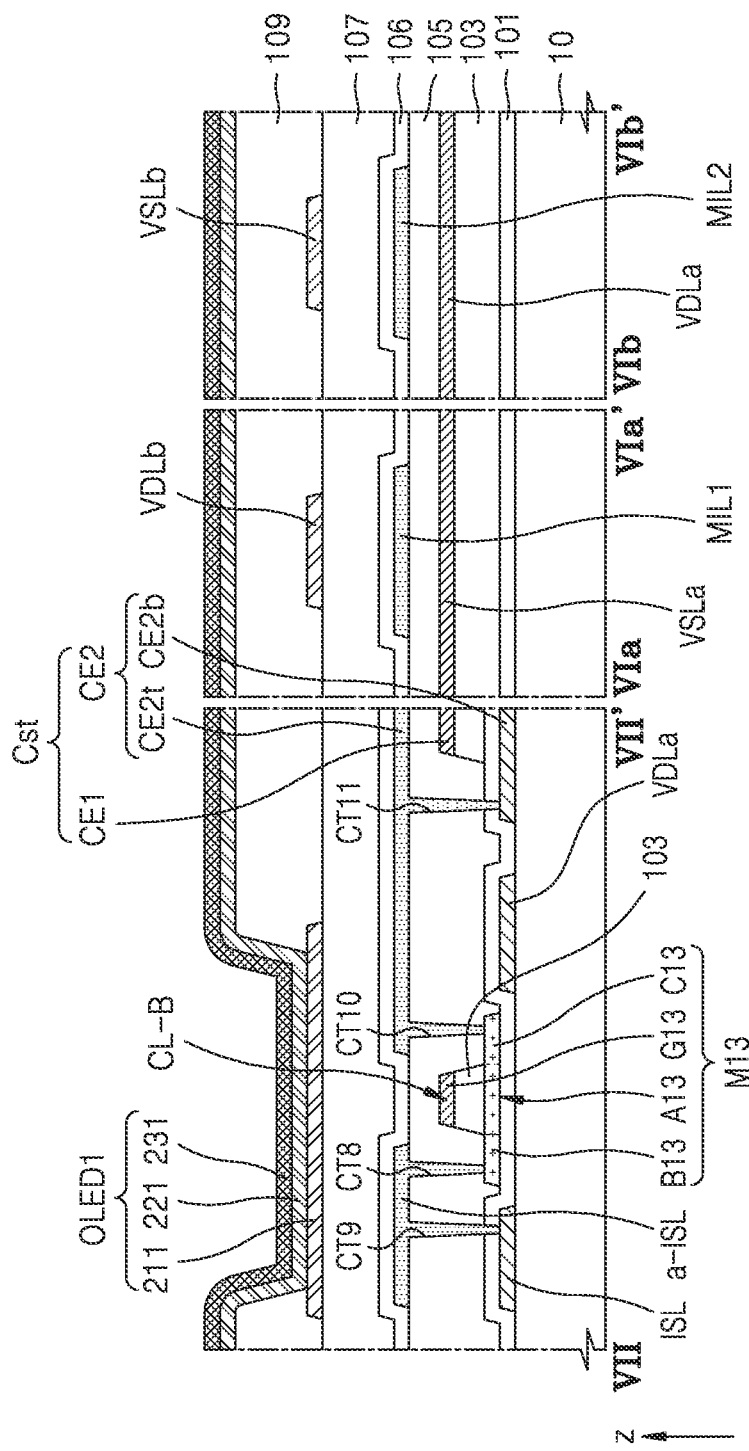
FIG. 11 is a cross-sectional view of a portion of a light-emitting panel according to an embodiment.

FIG. 11 is a cross-sectional view of a portion of a light-emitting panel according to an embodiment. In FIG. 11, the same reference symbols are used to denote the same or substantially the same elements and members as those described above with reference to FIG. 8, and thus, redundant description thereof may not be repeated.

Referring to FIG. 11, the first intermediate layer MIL1 may be arranged between the first common voltage line VSLa and the second driving voltage line VDLb. The second intermediate layer MIL2 may be arranged between the first driving voltage line VDLa and the second common voltage line VSLb.

In the present embodiment, the first common voltage line VSLa and the first driving voltage line VDLa may be arranged on the gate insulating layer 103. The first common voltage line VSLa and the first driving voltage line VDLa may include the same or substantially the same material as that of the gate electrode, and may be arranged at (e.g., in or on) the same layer as that of the gate electrode. For example, as shown in FIG. 11, the first common voltage line VSLa and the first driving voltage line VDLa may be arranged at (e.g., in or on) the same layer as that of the first sensing gate electrode G13 of the first sensing transistor M13.

The second driving voltage line VDLb and/or the second common voltage line VSLb may be arranged on the via insulating layer 107. The second driving voltage line VDLb and/or the second common voltage line VSLb may include the same or substantially the same material as that of the first electrode 211 of the first organic light-emitting diode OLED1, and be arranged at (e.g., in or on) the same layer as that of the first electrode 211 of the first organic light-emitting diode OLED1.

In the present embodiment, the first intermediate layer MIL1 and/or the second intermediate layer MIL2 may be arranged on the interlayer insulating layer 105. The first intermediate layer MIL1 and/or the second intermediate layer MIL2 may include the same or substantially the same material as that of the second capacitor electrode of the storage capacitor, and may be arranged at (e.g., in or on) the same layer as that of the second capacitor electrode of the storage capacitor. The first intermediate layer MIL1 and/or the second intermediate layer MIL2 may include a metal, for example, such as molybdenum (Mo), copper (Cu), and/or titanium (Ti). For example, as shown in FIG. 11, the first intermediate layer MIL1 and/or the second intermediate layer MIL2 may be arranged at (e.g., in or on) the same layer as that of the second sub-electrode CE2t of the first storage capacitor Cst1.

The interlayer insulating layer 105 may be arranged between the first common voltage line VSLa and the first intermediate layer MIL1. The inorganic protection layer 106 and the via insulating layer 107 may be arranged between the first intermediate layer MIL1 and the second driving voltage line VDLb. A width of the first intermediate layer MIL1 may be greater than a width of the second driving voltage line VDLb.

Similarly, the interlayer insulating layer 105 may be arranged between the first driving voltage line VDLa and the second intermediate layer MIL2. The inorganic protection layer 106 and the via insulating layer 107 may be arranged between the second intermediate layer MIL2 and the second common voltage line VSLb. A width of the second intermediate layer MIL2 may be greater than a width of the second common voltage line VSLb.

Figure 12:
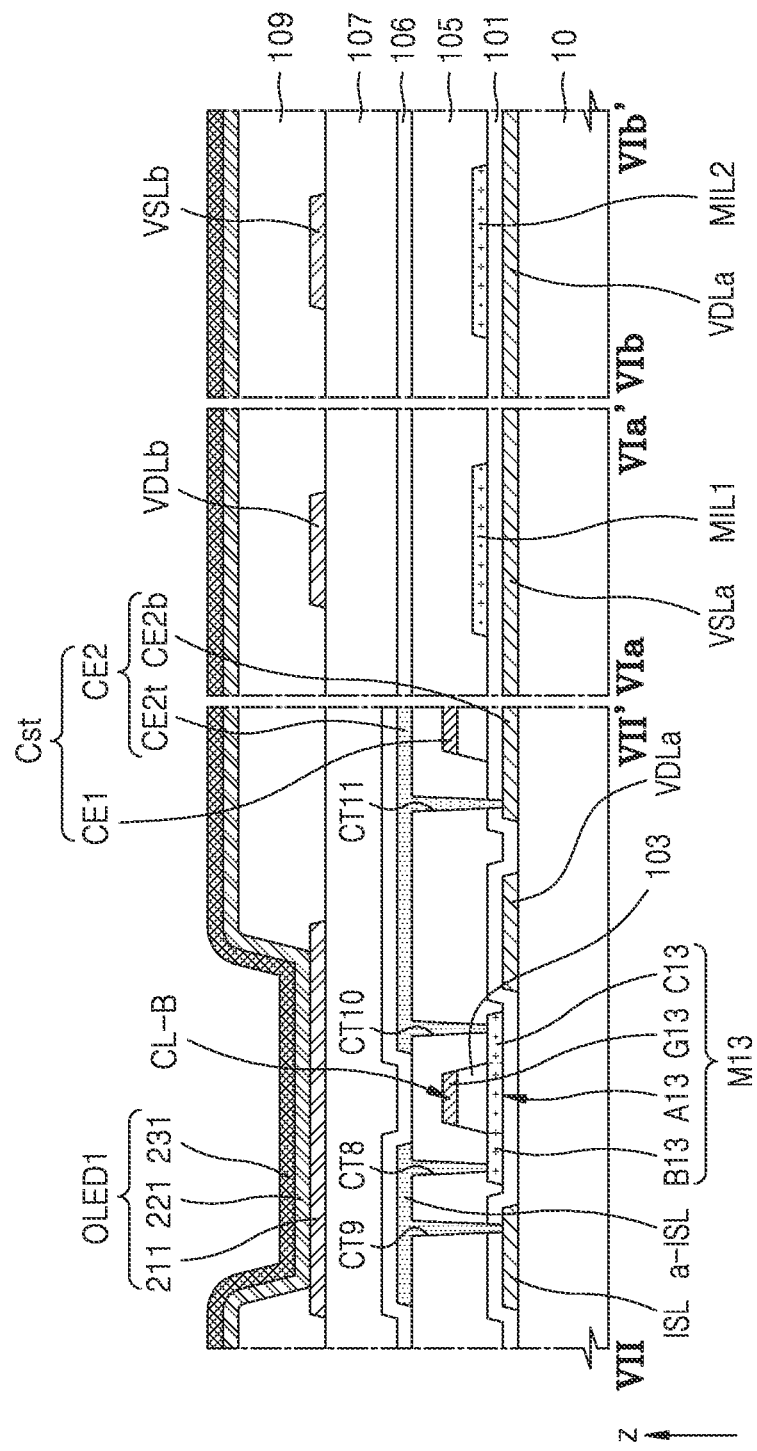
FIG. 12 is a cross-sectional view of a portion of a light-emitting panel according to an embodiment.

FIG. 12 is a cross-sectional view of a portion of a light-emitting panel according to an embodiment. In FIG. 12, the same reference symbols are used to denote the same or substantially the same elements and members as those described above with reference to FIG. 8, and thus, redundant description thereof may not be repeated.

Referring to FIG. 12, the first intermediate layer MIL1 may be arranged between the first common voltage line VSLa and the second driving voltage line VDLb. The second intermediate layer MIL2 may be arranged between the first driving voltage line VDLa and the second common voltage line VSLb.

In the present embodiment, the first common voltage line VSLa and the first driving voltage line VDLa may be arranged between the first substrate 10 and the buffer layer 101. The second driving voltage line VDLb and/or the second common voltage line VSLb may be arranged on the via insulating layer 107. The second driving voltage line VDLb and/or the second common voltage line VSLb may include the same or substantially the same material as that of the first electrode 211 of the first organic light-emitting diode OLED1, and may be arranged at (e.g., in or on) the same layer as that of the first electrode 211 of the first organic light-emitting diode OLED1.

In the present embodiment, the first intermediate layer MIL1 and/or the second intermediate layer MIL2 may be arranged on the buffer layer 101. The first intermediate layer MIL1 and/or the second intermediate layer MIL2 may include the same or substantially the same material as that of the semiconductor layer, and may be arranged at (e.g., in or on) the same layer as that of the semiconductor layer. The first intermediate layer MIL1 and/or the second intermediate layer MIL2 may include an oxide semiconductor or a silicon-based semiconductor. For example, as shown in FIG. 12, the first intermediate layer MIL1 and/or the second intermediate layer MIL2 may be arranged at (e.g., in or on) the same layer as that of the first sensing semiconductor layer A13.

The buffer layer 101 may be arranged between the first common voltage line VSLa and the first intermediate layer MIL1. The interlayer insulating layer 105, the inorganic protection layer 106, and the via insulating layer 107 may be arranged between the first intermediate layer MIL1 and the second driving voltage line VDLb. A width of the first intermediate layer MIL1 may be greater than a width of the second driving voltage line VDLb.

Similarly, the buffer layer 101 may be arranged between the first driving voltage line VDLa and the second intermediate layer MIL2. The interlayer insulating layer 105, the inorganic protection layer 106, and the via insulating layer 107 may be arranged between the second intermediate layer MIL2 and the second common voltage line VSLb. A width of the second intermediate layer MIL2 may be greater than a width of the second common voltage line VSLb.

Figure 13:
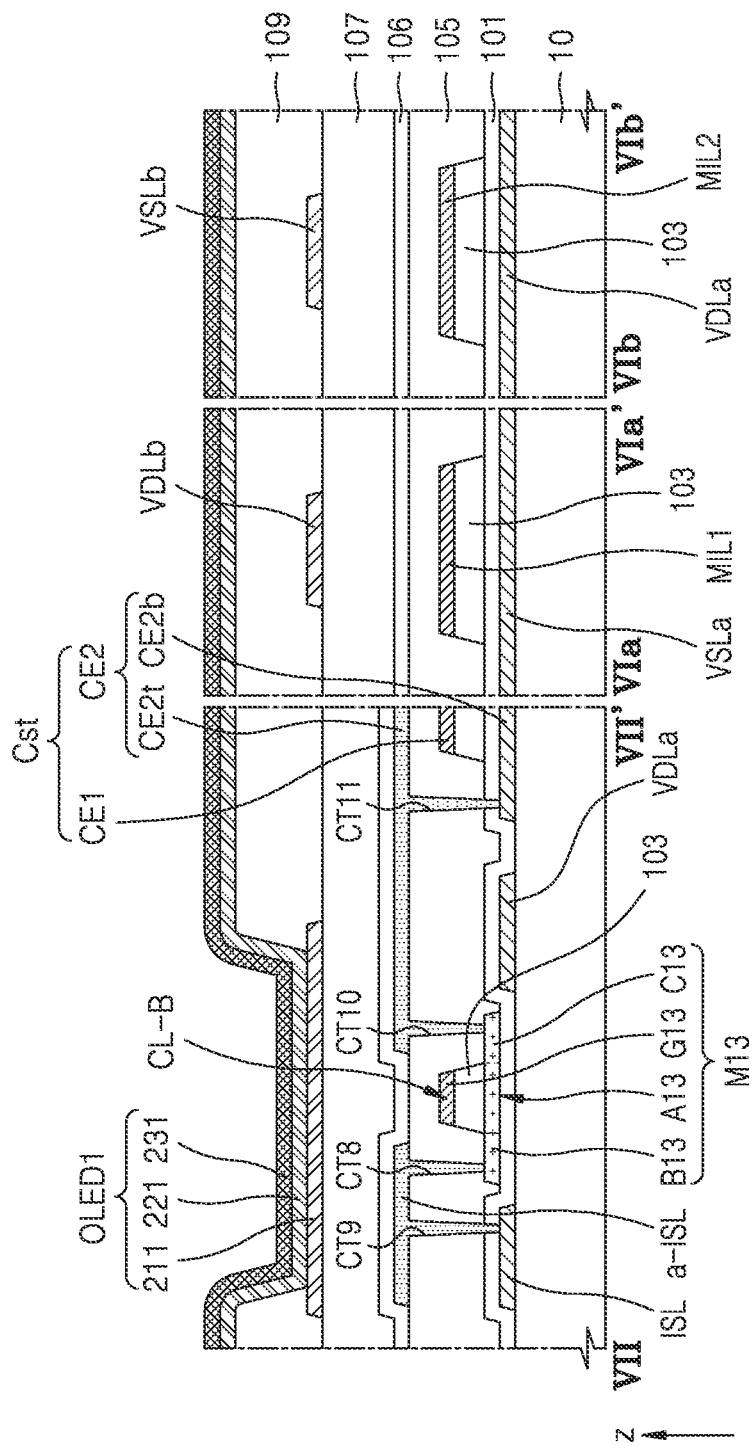
FIG. 13 is a cross-sectional view of a portion of a light-emitting panel according to an embodiment.

FIG. 13 is a cross-sectional view of a portion of a light-emitting panel according to an embodiment. In FIG. 13, the same reference symbols are used to denote the same or substantially the same elements and members as those described above with reference to FIG. 8, and thus, redundant description thereof may not be repeated.

Referring to FIG. 13, the first intermediate layer MIL1 may be arranged between the first common voltage line VSLa and the second driving voltage line VDLb. The second intermediate layer MIL2 may be arranged between the first driving voltage line VDLa and the second common voltage line VSLb.

In the present embodiment, the first common voltage line VSLa and the first driving voltage line VDLa may be arranged between the first substrate 10 and the buffer layer 101. The second driving voltage line VDLb and/or the second common voltage line VSLb may be arranged on the via insulating layer 107. The second driving voltage line VDLb and/or the second common voltage line VSLb may include the same or substantially the same material as that of the first electrode 211 of the first organic light-emitting diode OLED1, and may be arranged at (e.g., in or on) the same layer as that of the first electrode 211 of the first organic light-emitting diode OLED1.

In the present embodiment, the first intermediate layer MIL1 and/or the second intermediate layer MIL2 may be arranged on the gate insulating layer 103. The first intermediate layer MIL1 and/or the second intermediate layer MIL2 may include the same or substantially the same material as that of the gate electrode, and may be arranged at (e.g., in or on) the same layer as that of the gate electrode. For example, as shown in FIG. 13, the first intermediate layer MIL1 and/or the second intermediate layer MIL2 may be arranged at (e.g., in or on) the same layer as that of the first sensing gate electrode G13.

The buffer layer 101 and the gate insulating layer 103 may be arranged between the first common voltage line VSLa and the first intermediate layer MIL1. The buffer layer 101 may be deposited on an entire surface of the first substrate 10, and the gate insulating layer 103 may be patterned in the same or substantially the same shape as that of the first intermediate layer MIL1. The interlayer insulating layer 105, the inorganic protection layer 106, and the via insulating layer 107 may be arranged between the first intermediate layer MIL1 and the second driving voltage line VDLb. A width of the first intermediate layer MIL1 may be greater than a width of the second driving voltage line VDLb.

Similarly, the buffer layer 101 and the gate insulating layer 103 may be arranged between the first driving voltage line VDLa and the second intermediate layer MIL2. The buffer layer 101 may be deposited on an entire surface of the first substrate 10, and the gate insulating layer 103 may be patterned in the same or substantially the same shape as that of the second intermediate layer MIL2. The interlayer insulating layer 105, the inorganic protection layer 106, and the via insulating layer 107 may be arranged between the second intermediate layer MIL2 and the second common voltage line VSLb. A width of the second intermediate layer MIL2 may be greater than a width of the second common voltage line VSLb.

Although FIGS. 8 to 13 show that the first intermediate layer MIL1 and the second intermediate layer MIL2 are arranged at (e.g., in or on) the same layer as each other, the present disclosure is not limited thereto. For example, the first intermediate layer MIL1 and the second intermediate layer MIL2 may include different materials from each other, and/or may be arranged at (e.g., in or on) different layers from each other. As an example, the first intermediate layer MIL1 may include the same or substantially the same material as that of the gate electrode, and may be arranged on the gate insulating layer 103 (e.g., see FIG. 8). The second intermediate layer MIL2 may include the same or substantially the same material as that of the semiconductor layer, and may be arranged on the buffer layer 101 (e.g., see FIG. 9). Similarly, the arrangement of the region corresponding to the line VIa-VIa' and the region corresponding to the line VIb-VIb' shown in FIGS. 8 to 13 may be variously combined with each other.

Figure 14:
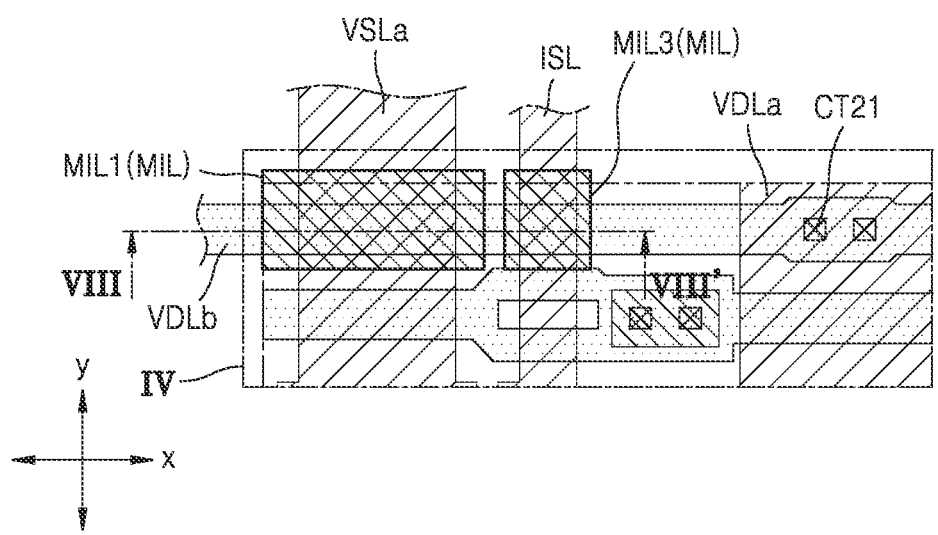
FIG. 14 is a plan view of a portion of a light-emitting panel according to an embodiment.
Figure 15:
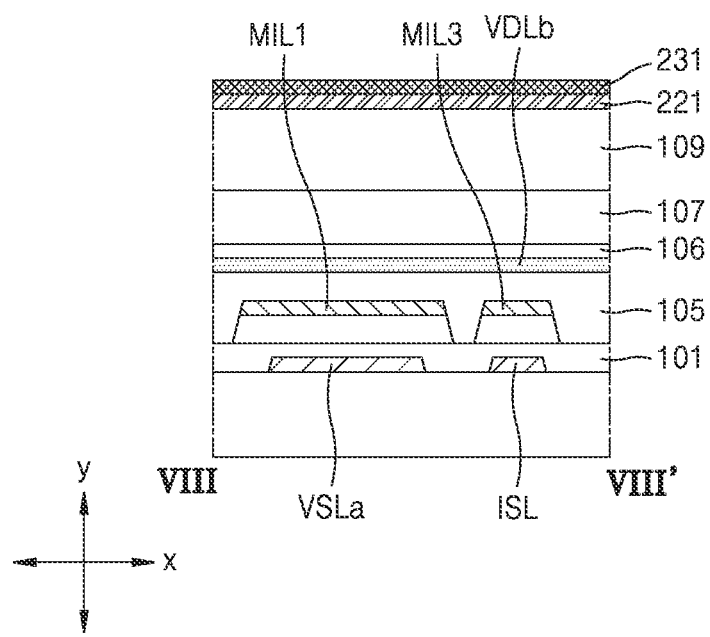
FIG. 15 is a cross-sectional view of the light-emitting panel taken along the line VIII-VIII' of FIG. 14.

FIG. 14 is a plan view of a portion of a light-emitting panel according to an embodiment. FIG. 15 is a cross-sectional view of the light-emitting panel taken along the line VIII-VIII' of FIG. 14. In FIGS. 14 and 15, the same reference symbols are used to denote the same elements and members as those described above with reference to FIGS. 5 and 8, and thus, redundant description thereof may not be repeated.

Referring to FIGS. 14 and 15, the intermediate layer MIL may be further arranged at (e.g., in or on) a region where the sensing line ISL crosses the second driving voltage line VDLb. In other words, the intermediate layer MIL may include the first intermediate layer MIL1 and a third intermediate layer MIL3. The first intermediate layer MIL1 may be arranged at (e.g., in or on) a region where the first common voltage line VSLa crosses the second driving voltage line VDLb.

The third intermediate layer MIL3 may be arranged at (e.g., in or on) a region where the sensing line ISL crosses the second driving voltage line VDLb. The sensing line ISL may be arranged below the third intermediate layer MIL3, and may extend in the y-direction. An insulating layer may be arranged between the sensing line ISL and the third intermediate layer MIL3. For example, the buffer layer 101 and the gate insulating layer 103 may be arranged between the sensing line ISL and the third intermediate layer MIL3. The sensing line ISL may be the bottom conductive layer BCL described above with reference to FIG. 3.

The second driving voltage line VDLb may be arranged over the first intermediate layer MIL1, and may extend in the x-direction. The second driving voltage line VDLb may be connected to the first driving voltage line VDLa through a contact hole CT21, and the first driving voltage line VDLa may extend in the y-direction. An insulating layer may be arranged between the second driving voltage line VDLb and the third intermediate layer MIL3. As an example, the interlayer insulating layer 105 may be arranged between the second driving voltage line VDLb and the third intermediate layer MIL3. The second driving voltage line VDLb may be the upper conductive layer UCL described above with reference to FIG. 3.

The third intermediate layer MIL3 may entirely cover an overlapping region where the sensing line ISL crosses and overlaps with the second driving voltage line VDLb. An area of the third intermediate layer MIL3 may be greater than an area of the overlapping region.

Because the third intermediate layer MIL3 is arranged, even though there may be particles or cracks occurring in a region where the sensing line ISL crosses the second driving voltage line VDLb, the sensing line ISL and the second driving voltage line VDLb may be prevented or substantially prevented from being short-circuited.

The first intermediate layer MIL1 and the third intermediate layer MIL3 may be arranged at (e.g., in or on) the same layer as each other, and may be spaced apart from each other. As an example, the first intermediate layer MIL1 and the third intermediate layer MIL3 may be arranged on the gate insulating layer 103. Because the first intermediate layer MIL1 is spaced apart from the third intermediate layer MIL3, even though cracks may occur in the inorganic insulating layer, a current path may not be formed between the first intermediate layer MIL1 and the third intermediate layer MIL3, and thus, a short circuit between adjacent wirings may be efficiently prevented or reduced.

The intermediate layer MIL may be additionally arranged between wirings extending in the x-direction and other wirings extending in the y-direction. As an example, the intermediate layer MIL may be arranged at (e.g., in or on) a region where the scan line SL crosses the data line DL, at (e.g., in or on) a region where the sensing line ISL crosses the second common voltage line VSLb, and/or the like. However, the present disclosure is not limited thereto, and various modifications may be made.

As described above, according to various embodiments of the present disclosure, the intermediate layer may be arranged between various wirings that cross each other, and thus, a short circuit and a coupling between the wirings may be prevented or substantially prevented. However, the spirit and scope of the present disclosure are not limited to such aspects and features.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
   a first driving voltage line extending in a first direction on a substrate;
   a first common voltage line extending in the first direction on the substrate;
   a driving transistor connected to the first driving voltage line;
   a storage capacitor connected to the driving transistor;
   a light-emitting diode connected to the driving transistor and the storage capacitor;
   a second driving voltage line extending in a second direction crossing the first direction, and connected to the first driving voltage line through a contact hole; and
   a first intermediate layer at an intersection region between the first common voltage line and the second driving voltage line,
   wherein the first intermediate layer is located between the first common voltage line and the second driving voltage line.

2. The display apparatus of claim 1, wherein the first intermediate layer has an isolated shape, and an area of the first intermediate layer is greater than an overlapping area at which the first common voltage line overlaps with the second driving voltage line in the intersection region.

3. The display apparatus of claim 1, further comprising:
   a first insulating layer between the first common voltage line and the first intermediate layer; and
   a second insulating layer between the first intermediate layer and the second driving voltage line.

4. The display apparatus of claim 1, further comprising:
   a second common voltage line extending in the second direction, and connected to the first common voltage line through a contact hole; and
   a second intermediate layer at an intersection region between the first driving voltage line and the second common voltage line,
   wherein the second intermediate layer is located between the first driving voltage line and the second common voltage line.

5. The display apparatus of claim 1, wherein the first common voltage line is located between the substrate and a semiconductor layer of the driving transistor, the first intermediate layer is located at a same layer as that of a gate electrode of the driving transistor, and the second driving voltage line is located at a same layer as that of one electrode of the storage capacitor.

6. The display apparatus of claim 1, wherein the first common voltage line is located between the substrate and a semiconductor layer of the driving transistor, the first intermediate layer is located at a same layer as that of the semiconductor layer of the driving transistor, and the second driving voltage line is located at a same layer as that of one electrode of the storage capacitor.

7. The display apparatus of claim 1, wherein the first common voltage line is located between the substrate and a semiconductor layer of the driving transistor, the first intermediate layer is located at a same layer as that of one electrode of the storage capacitor, and the second driving voltage line is located at a same layer as that of one electrode of the light-emitting diode.

8. The display apparatus of claim 1, wherein the first common voltage line is located at a same layer as that of a gate electrode of the driving transistor, the first intermediate layer is located at a same layer as that of one electrode of the storage capacitor, and the second driving voltage line is located at a same layer as that of one electrode of the light-emitting diode.

9. The display apparatus of claim 1, wherein the first common voltage line is located between the substrate and a semiconductor layer of the driving transistor, the first intermediate layer is located at a same layer as that of the semiconductor layer of the driving transistor, and the second driving voltage line is located at a same layer as that of one electrode of the light-emitting diode.

10. The display apparatus of claim 1, wherein the first common voltage line is located between the substrate and a semiconductor layer of the driving transistor, the first intermediate layer is located at a same layer as that of a gate electrode of the driving transistor, and the second driving voltage line is located at a same layer as that of one electrode of the light-emitting diode.

11. The display apparatus of claim 1, further comprising:
a sensing line extending in the first direction from one side of the first common voltage line; and
a third intermediate layer located at an intersection region between the sensing line and the second driving voltage line,
wherein the third intermediate layer is located between the sensing line and the second driving voltage line.

12. The display apparatus of claim 11, wherein the first intermediate layer is spaced from the third intermediate layer.

13. A display apparatus comprising:
a first driving voltage line extending in a first direction on a substrate;
a first common voltage line extending in the first direction on the substrate;
a buffer layer on the first driving voltage line and the first common voltage line;
a transistor on the buffer layer;
a storage capacitor connected to the transistor;
a light-emitting diode on the storage capacitor;
a second driving voltage line extending in a second direction crossing the first direction, and connected to the first driving voltage line through a contact hole;
a second common voltage line extending in the second direction, and connected to the first common voltage line through a contact hole;
a first intermediate layer located at an intersection region between the first common voltage line and the second driving voltage line; and
a second intermediate layer located at an intersection region between the first driving voltage line and the second common voltage line.

14. The display apparatus of claim 13, wherein the first intermediate layer is located at a same layer as that of a gate electrode of the transistor.

15. The display apparatus of claim 13, wherein the first intermediate layer is located at a same layer as that of a semiconductor layer of the transistor.

16. The display apparatus of claim 13, wherein the storage capacitor comprises a second sub-electrode located at a layer different from that of a gate electrode of the transistor, and
wherein the first intermediate layer is located at a same layer as that of the second sub-electrode.

17. The display apparatus of claim 13, wherein the light-emitting diode comprises a first electrode, an emission layer, and a second electrode, and
wherein the second common voltage line is located at a same layer as that of the first electrode.

18. The display apparatus of claim 17, wherein the second driving voltage line is located at a same layer as that of the first electrode.

19. The display apparatus of claim 13, wherein the storage capacitor comprises a second sub-electrode located at a layer different from that of a gate electrode of the transistor, and
wherein the second common voltage line and the second driving voltage line are located at a same layer as that of the second sub-electrode.

20. The display apparatus of claim 13, wherein the first intermediate layer and the second intermediate layer each have an isolated shape.

* * * * *